(12) United States Patent
Lee et al.

(10) Patent No.: US 11,711,966 B2
(45) Date of Patent: Jul. 25, 2023

(54) POLYMER AND ORGANIC SOLAR CELL COMPRISING SAME

(71) Applicant: LG CHEM, LTD., Seoul (KR)

(72) Inventors: Jiyoung Lee, Daejeon (KR); Doowhan Choi, Daejeon (KR); Bogyu Lim, Daejeon (KR); Ji Hoon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 109 days.

(21) Appl. No.: 16/500,871

(22) PCT Filed: Feb. 26, 2019

(86) PCT No.: PCT/KR2019/002311
§ 371 (c)(1),
(2) Date: Oct. 4, 2019

(87) PCT Pub. No.: WO2019/177284
PCT Pub. Date: Sep. 19, 2019

(65) Prior Publication Data
US 2021/0305511 A1 Sep. 30, 2021

(30) Foreign Application Priority Data
Mar. 12, 2018 (KR) .......... 10-2018-0028525

(51) Int. Cl.
*H10K 85/10* (2023.01)
*C08G 61/12* (2006.01)
*H10K 30/30* (2023.01)

(52) U.S. Cl.
CPC ......... *H10K 85/113* (2023.02); *C08G 61/126* (2013.01); *H10K 85/151* (2023.02);
(Continued)

(58) Field of Classification Search
CPC ............ H01L 51/0036; H01L 51/0043; H01L 51/4253; H01L 2031/0344; H01L 31/0256; H01L 51/0071; H01L 51/424; C08G 61/126; C08G 2261/124; C08G 2261/1412; C08G 2261/1424; C08G 2261/149;
(Continued)

(56) References Cited

U.S. PATENT DOCUMENTS

2013/0048075 A1* 2/2013 Leclerc ............... H01L 51/0036 526/256
2018/0033970 A1* 2/2018 Lee ..................... C08G 61/12
2019/0023835 A1 1/2019 Lim et al.

FOREIGN PATENT DOCUMENTS

CN 103435783 12/2013
CN 106467547 3/2017
(Continued)

OTHER PUBLICATIONS

Yuze Lin "An Electron Acceptor Challenging Fullerenes for Efficient Polymer Solar Cells" Adv. Mater. 2015, 27, 1170-1174 (Year: 2015).*

(Continued)

*Primary Examiner* — Michael Y Sun
(74) *Attorney, Agent, or Firm* — Myers Bigel, P.A.

(57) ABSTRACT

The present specification relates to a polymer including a first unit of Chemical Formula 1; a second unit of Chemical Formula 2; and a third unit of Chemical Formula 3 or 4, and an organic solar cell including the same.

15 Claims, 2 Drawing Sheets

(52) U.S. Cl.
CPC ... *C08G 2261/12* (2013.01); *C08G 2261/146* (2013.01); *C08G 2261/149* (2013.01); *C08G 2261/1412* (2013.01); *C08G 2261/1424* (2013.01); *C08G 2261/312* (2013.01); *C08G 2261/3223* (2013.01); *C08G 2261/3243* (2013.01); *C08G 2261/514* (2013.01); *C08G 2261/592* (2013.01); *C08G 2261/64* (2013.01); *C08G 2261/91* (2013.01); *H10K 30/30* (2023.02)

(58) Field of Classification Search
CPC .......... C08G 2261/18; C08G 2261/228; C08G 2261/312; C08G 2261/3223; C08G 2261/3243; C08G 2261/3246; C08G 2261/41; C08G 2261/91; C08G 2261/12; C08G 2261/146; C08G 2261/514; C08G 2261/592; C08G 2261/64; C08G 2261/1414; C08G 2261/148; C08G 2261/1646; C08G 2261/3241; C08G 2261/344; C08G 2261/414; C08G 2261/51; C08G 61/12; Y02E 10/549; H10K 85/113; H10K 85/151; H10K 30/30; H10K 85/111; H10K 85/655; H10K 85/6576; H10K 30/20; Y02P 70/50
See application file for complete search history.

(56) References Cited

FOREIGN PATENT DOCUMENTS

| KR | 1020160075370 | 6/2016 | |
| KR | 1020160146100 | 12/2016 | |
| KR | 1020170089576 | 8/2017 | |
| WO | WO-2016099218 A2 * | 6/2016 | ............. C08G 61/12 |

OTHER PUBLICATIONS

Maojie Zhang "Synergistic Effect of Fluorination on Molecular Energy Level Modulation in Highly Efficient Photovoltaic Polymers" Adv. Mater. 2014, 26, 1118-1123 (Year: 2014).*
Jiangsheng Yu "Selenium-substituted polymers for improved photovoltaic performance" Phys. Chem. Chem. Phys., 2016, 18, 7978 (Year: 2016).*
Ming Liu "Quinoxaline-based conjugated polymers for polymer solar cells" Polym. Chem., 2017, 8, 4613 (Year: 2017).*
Simon Lévesque "Thiocarbonyl Substitution in 1,4-Dithioketopyrrolopyrrole and Thienopyrroledithione Derivatives: An Experimental and Theoretical Study" J. Phys. Chem. C 2014, 118, 3953-3959 (Year: 2014).*
Ji-Hoon Kim "Benzotriazole-based donor-accept or type semiconducting polymers with different alkyl side chains for photovoltaic devices" Solar EnergyMaterials&SolarCells108(2013)113-125 (Year: 2013).*
Liu et al. "Highly Efficient Photovoltaic Polymers Based on Benzodithiophene and Quinoxaline with Deeper HOMO Levels" Macromolecules, 48(15):5127-5178 (2015).
Zhang et al. "Fluorinated and Alkylthiolated Polymeric Donors Enable both Efficient Fullerene and Nonfullerene Polymer Solar Cells" Advanced Functional Materials, 1706404:1-15(2018).
Yu et al. "Selenium-substituted polymers for improved photovoltaic performance" Physical Chemistry Chemical Physics, 18:7978-7986 (2016).
Cui et al. "The Critical Role of Anode Work Function in Non-Fullerene Organic Solar Cells Unveiled by Counterion-Size-Controlled Self-Doping Conjugated Polymers" Chemistry of Materials, 30:1078-1084 (2018).
English translation of the International Search Report corresponding to International Patent Application No. PCT/KR2019/002311 (3 pages) (dated May 28, 2019).
Lee et al. "A feasible random copolymer approach for high-efficiency polymeric photovoltaic cells" Journal of Materials Chemistry A, 4:11439-11445 (2016).
Tang, C.W. "Two-layer organic photovoltaic cell" Applied Physics Letters, 48(2):183-185 (1986).
Yu et al. "Polymer Photovoltaic Cells: Enhanced Efficiencies via a Network of Internal Donor-Acceptor Heterojunctions" Science, 270:1789-1791 (1995).
Zhao et al. "Environmentally Friendly Solvent-Processed Organic Solar Cells that are Highly Efficient and Adaptable for the Blade-Coating Method" Advanced Materials, 30(1704837):1-7 (2018).
Zheng et al. "Efficient Charge Transfer and Fine-Tuned Energy Level Alignment in a THF-Processed Fullerene-Free Organic Solar Cell with 11.3% Efficiency" Advanced Materials, 29(1604241):1-6 (2017).

* cited by examiner

POLYMER AND ORGANIC SOLAR CELL COMPRISING SAME

CROSS REFERENCE TO RELATED APPLICATIONS

This application is a 35 U.S.C. § 371 national stage application of PCT International Application No. PCT/KR2019/002311, filed Feb. 26, 2019, which claims priority from Korean Patent Application No. 10-2018-0028525, filed Mar. 12, 2018, the contents of which are incorporated herein in their entireties by reference. The above-referenced PCT International Application was published in the Korean language as International Publication No. WO 2019/177284 on Sep. 19, 2019.

TECHNICAL FIELD

The present specification relates to a polymer and an organic solar cell including the same.

BACKGROUND ART

An organic solar cell is a device capable of directly converting solar energy to electric energy by applying a photovoltaic effect. Solar cells are divided into inorganic solar cells and organic solar cells depending on the materials forming a thin film, and since existing inorganic solar cells already have limits in economic feasibility and material supplies, organic solar cells that are readily processed, inexpensive and have various functions have been highly favored as a long-term alternative energy source.

For solar cells, it is important to increase efficiency so as to output as much electric energy as possible from solar energy, and in order to increase efficiency, generating as much excitons as possible inside a semiconductor is important, however, taking the generated charges outside without loss is also important. One of the reasons for the charge loss is the dissipation of the generated electrons and holes by recombination. Various methods for delivering the generated electrons or holes to an electrode without loss have been proposed, however, most of the methods require additional processes, and accordingly, the fabricating costs may increase.

DISCLOSURE

Technical Problem

The present specification is directed to providing a polymer and an organic solar cell including the same.

Technical Solution

One embodiment of the present specification provides a polymer including a first unit represented by the following Chemical Formula 1; a second unit represented by the following Chemical Formula 2; and a third unit represented by the following Chemical Formula 3 or 4.

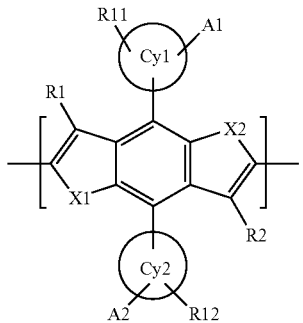

[Chemical Formula 1]

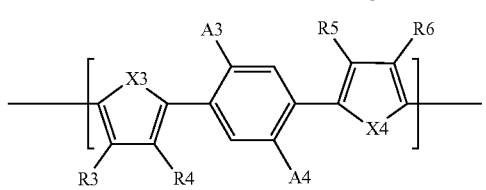

[Chemical Formula 2]

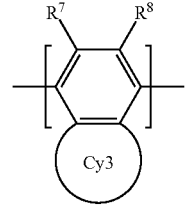

[Chemical Formula 3]

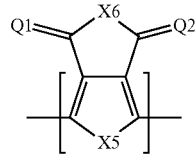

[Chemical Formula 4]

In Chemical Formulae 1 to 4,

X1 to X6 are the same as or different from each other, and each independently CRR', NR, O, SiRR', PR, S, GeRR', Se or Te, A1 to A4 are the same as or different from each other, and each independently a halogen group, Cy1 to Cy3 are the same as or different from each other, and each independently a substituted or unsubstituted heterocyclic group, Q1 and Q2 are the same as or different from each other, and each independently O or S, R, R', R" and R1 to R8 are the same as or different from each other, and each independently hydrogen; deuterium; a halogen group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthio group; a substituted or unsubstituted arylthio group; a substituted or unsubstituted alkylsulfoxy group; a substituted or unsubstituted arylsulfoxy group; a substituted or unsubstituted alkenyl group; a substituted or unsubstituted amine group; a substituted or unsubstituted aryl group; or a substituted or unsubstituted heterocyclic group, and R11 and R12 are the same as or different from each other, and each independently a substituted or unsubstituted alkyl group; a substituted or unsubstituted alkoxy group; or a substituted or unsubstituted alkylthio group.

Another embodiment of the present specification provides an organic solar cell including a first electrode; a second electrode disposed opposite to the first electrode; and one or more organic material layers disposed between the first electrode and the second electrode and including a photoactive layer, wherein the photoactive layer includes the polymer.

Advantageous Effects

A polymer according to one embodiment of the present specification is an electoconductive material, and has thermal stability, excellent solubility and high electron mobility. Accordingly, excellent power conversion efficiency can be obtained when used in an organic solar cell.

In addition, the polymer according to one embodiment of the present specification has a high HOMO energy level, and an organic solar cell including the same as an electron donor of a photoactive layer has excellent open-circuit voltage properties.

REFERENCE NUMERAL

Figures 1, 2:
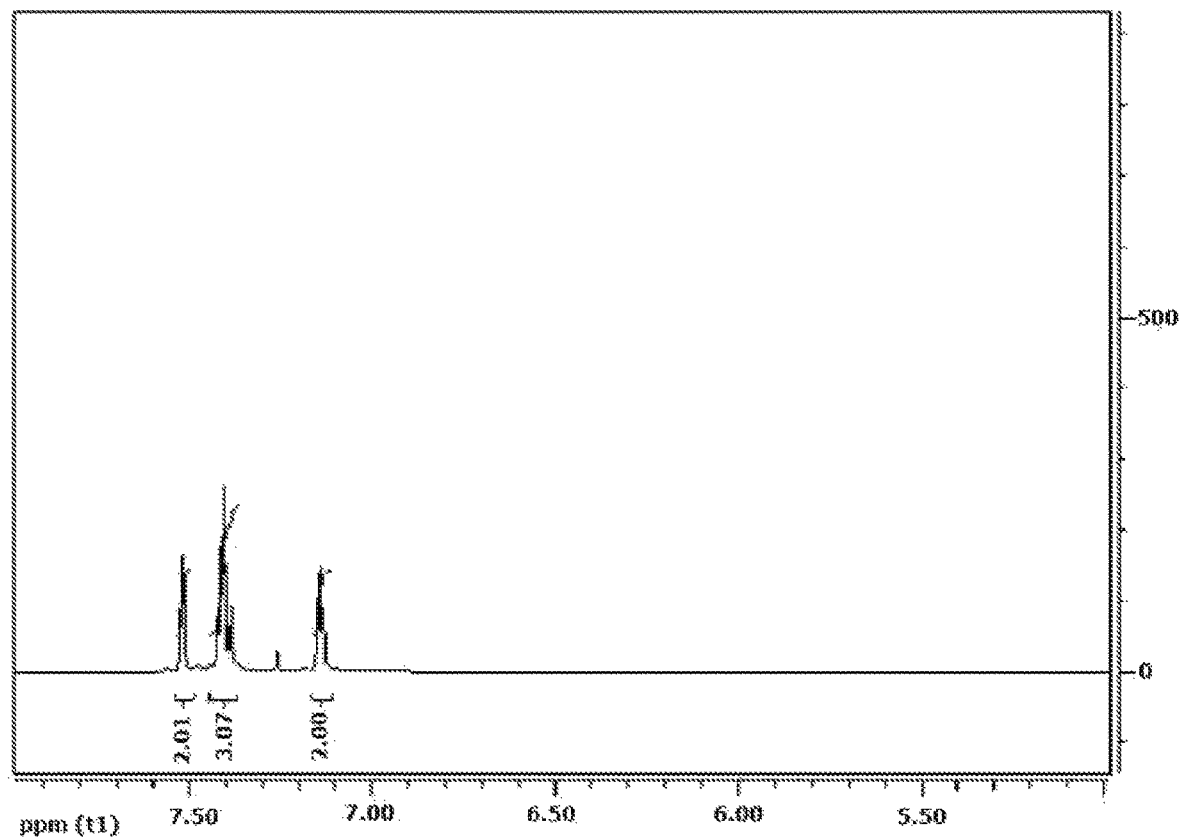
FIG. 1 is a diagram illustrating an organic solar cell according to one embodiment of the present specification.
FIG. 2 is a diagram presenting an NMR spectrum of Chemical Formula K synthesized in a preparation example.

101: First Electrode
102: Electron Transfer Layer
103: Photoactive Layer
104: Hole Transfer Layer
105: Second Electrode

MODE FOR DISCLOSURE

Hereinafter, the present specification will be described in more detail.

In the present specification, a 'unit' is a repeated structure included in a monomer of a polymer, and means a structure in which the monomer bonds in the polymer by polymerization.

In the present specification, the meaning of 'including a unit' means being included in a main chain in a polymer.

In the present specification, a description of a certain part "including" certain constituents means capable of further including other constituents, and does not exclude other constituents unless particularly stated on the contrary.

In the present specification, a description of one member being placed "on" another member includes not only a case of the one member adjoining the another member but a case of still another member being present between the two members.

In the present specification, an energy level means energy magnitude. Therefore, even when an energy level is expressed in a negative (−) direction from a vacuum level, the energy level is interpreted to mean an absolute value of the corresponding energy value. For example, a HOMO energy level means a distance from a vacuum level to the highest occupied molecular orbital. In addition, a LUMO energy level means a distance from a vacuum level to the lowest unoccupied molecular orbital.

One embodiment of the present specification provides a polymer including a first unit represented by the following Chemical Formula 1; a second unit represented by the following Chemical Formula 2; and a third unit represented by the following Chemical Formula 3 or 4.

Specifically, the first unit represented by Chemical Formula 1 may be substituted with a halogen group, preferably fluorine, and this lowers a HOMO energy level leading to an effect of enhancing an open-circuit voltage.

In the present specification, examples of substituents are described below, however, the substituents are not limited thereto.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the term 'substituted or unsubstituted' means being substituted with one or more substituents selected from the group consisting of deuterium; a halogen group; a nitrile group; a nitro group; a hydroxyl group; a substituted or unsubstituted alkyl group; a substituted or unsubstituted cycloalkyl group; a substituted or unsubstituted alkoxy group; a substituted or unsubstituted alkylthio group; a substituted or unsubstituted aryloxy group; a substituted or unsubstituted alkenyl group; a substituted or unsubstituted aryl group; and a substituted or unsubstituted heterocyclic group, being substituted with a substituent linking two or more substituents among the substituents illustrated above, or having no substituents. For example, "a substituent linking two or more substituents" may include a biphenyl group. In other words, a biphenyl group may be an aryl group, or interpreted as a substituent linking two phenyl groups.

In the present specification, examples of the halogen group may include fluorine, chlorine, bromine or iodine.

In the present specification, the alkyl group may be linear or branched, and although not particularly limited thereto, the number of carbon atoms is preferably from 1 to 50. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylhexyl, 4-methylhexyl, 5-methylhexyl and the like, but are not limited thereto.

In the present specification, the cycloalkyl group is not particularly limited, but preferably has 3 to 60 carbon atoms. Specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

When the aryl group is a monocyclic aryl group in the present specification, the number of carbon atoms is not particularly limited, but is preferably from 6 to 25. Specific examples of the monocyclic aryl group may include a phenyl group, a biphenyl group, a terphenyl group and the like, but are not limited thereto.

When the aryl group is a polycyclic aryl group in the present specification, the number of carbon atoms is not particularly limited, but is preferably from 10 to 24. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorenyl group may be substituted, and adjacent substituents may bond to each other to form a ring.

In the present specification, the arylene group means the aryl group having two bonding sites, that is, a divalent group. Descriptions on the aryl group provided above may be applied thereto except for those being each divalent.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy and the like, but are not limited thereto.

In the present specification, the alkylthio group means a substituent represented by —S—R (R is an alkyl group), and may be linear, branched or cyclic. The number of carbon atoms of the alkylthio group is not particularly limited, but is preferably from 1 to 20. Specific examples thereof may include methylthio, ethylthio, n-propylthio, isopropylthio, i-propylthio, n-butylthio, isobutylthio, tert-butylthio, sec-butylthio, n-pentylthio, neopentylthio, isopentylthio, n-hexylthio, 3,3-dimethylbutylthio, 2-ethylbutylthio, n-octylthio, n-nonylthio, n-decylthio, benzylthio, p-methylbenzylthio and the like, but are not limited thereto.

In the present specification, the aryl group in the aryloxy group, the arylthio group and the arylsulfoxy group is the same as the examples of the aryl group described above. Specific examples of the aryloxy group may include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, benzyloxy, p-methylbenzyloxy and the like, examples of the arylthio group may include a phenylthio group, a 2-methylphenylthio group, a 4-tert-butylphenylthio group and the like, and examples of the arylsulfoxy group may include a benzenesulfoxy group, p-toluenesulfoxy group and the like, however, the aryloxy group, the arylthio group and the arylsulfoxy group are not limited thereto.

In the present specification, the alkyl group in the alkylthio group and the alkylsulfoxy group is the same as the examples of the alkyl group described above. Specific examples of the allcylsulfoxy group may include a methylsulfoxy group, an ethylsulfoxy group, a propylsulfoxy group, a butylsulfoxy group and the like, but are not limited thereto.

In the present specification, the alkenyl group may be linear or branched, and although not particularly limited thereto, the number of carbon atoms is preferably from 2 to 40. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, the number of carbon atoms of the amine group is not particularly limited, but is preferably from 1 to 30. In the amine group, the N atom may be substituted with an aryl group, an alkyl group, an arylalkyl group, a heterocyclic group and the like, and specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

In the present specification, the heterocyclic group is a group including one or more atoms that are not carbon, that is, heteroatoms, and specifically, the heteroatom may include one or more atoms selected from the group consisting of O, N, Se, S and the like. The number of carbon atoms of the heterocyclic group is not particularly limited, but is preferably from 2 to 60. Examples of the heterocyclic group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a phenothiazinyl group, a dibenzofuranyl group, a selenadiazolyl group and the like, but are not limited thereto.

In one embodiment of the present specification, X1 to X5 are each S.

In one embodiment of the present specification, X6 is NR, and R is an alkyl group having 1 to 20 carbon atoms.

In one embodiment of the present specification, X6 is NR, and R is ethylhexyl.

In one embodiment of the present specification, X6 is NR, and R is 2-ethylhexyl.

In one embodiment of the present specification, A1 to A4 are each fluorine.

In one embodiment of the present specification, Cy1 and Cy2 are each a heterocyclic group having 2 to 10 carbon atoms.

In one embodiment of the present specification, Cy1 and Cy2 are each a thiophene group.

In one embodiment of the present specification, Cy3 is a heterocyclic group.

In one embodiment of the present specification, Cy3 is a heterocyclic group substituted with an alkyl group or an aryl group.

In one embodiment of the present specification, Cy3 is a heterocyclic group including S, Se and/or N as a heteroatom.

In one embodiment of the present specification, Cy3 is a pyrazinyl group.

In one embodiment of the present specification, Cy3 is a pyrazinyl group substituted with an alkyl group or an aryl group.

In one embodiment of the present specification, Cy3 is a selenadiazole group.

In one embodiment of the present specification, Cy3 is a 1,2,5-selenadiazolyl group.

In one embodiment of the present specification, Cy3 is a thiadiazolyl group.

In one embodiment of the present specification, Cy3 is a 1,2,5-thiadiazolyl group.

In one embodiment of the present specification, Cy3 is a triazole group.

In one embodiment of the present specification, Cy3 is a triazole group substituted with an alkyl group or an aryl group.

In one embodiment of the present specification, Q1 and Q2 are each O.

In one embodiment of the present specification, Q1 and Q2 are each S.

In one embodiment of the present specification, R1 to R6 are each hydrogen.

In one embodiment of the present specification, R7 and R8 are each a substituted or unsubstituted alkoxy group.

In one embodiment of the present specification, R7 and R8 are each an alkoxy group having 1 to 20 carbon atoms.

In one embodiment of the present specification, R7 and R8 are each dodecyloxy.

In one embodiment of the present specification, R7 and R8 are each (ethylhexyl)oxy.

In one embodiment of the present specification, R7 and R8 are each (2-ethylhexyl)oxy.

In one embodiment of the present specification, R7 and R8 are each a halogen group.

In one embodiment of the present specification, R7 and R8 are each fluorine.

In one embodiment of the present specification, R7 and R8 are each hydrogen.

In one embodiment of the present specification, R11 and R12 are each an alkyl group having 1 to 20 carbon atoms.

In one embodiment of the present specification, R11 and R12 are each an alkyl group having 5 to 15 carbon atoms.

In one embodiment of the present specification, R11 and R12 are each hexyl.

In one embodiment of the present specification, R11 and R12 are each ethylhexyl.

In one embodiment of the present specification, R11 and R12 are each 2-ethylhexyl.

In one embodiment of the present specification, R11 and R12 are each butylhexyl.

In one embodiment of the present specification, R11 and R12 are each 2-butylhexyl. In one embodiment of the present specification, the first unit may be represented by the following Chemical Formula 1-1.

In Chemical Formula 1-1,

R1, R2, R11, R12, X1, X2, A1 and A2 have the same definitions as in Chemical Formula 1, and X7 and X8 are the same as or different from each other, and each independently NR, O, SiRR', PR, S, GeRR', Se or Te.

In one embodiment of the present specification, X7 and X8 are each S.

In one embodiment of the present specification, the first unit may be represented by the following Chemical Formula 1-2.

[Chemical Formula 1-2]

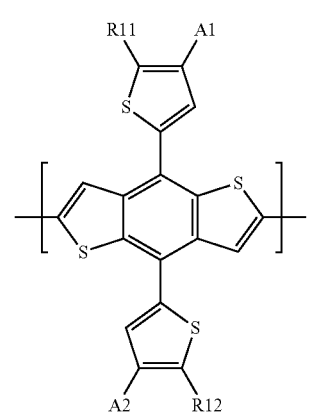

In Chemical Formula 1-2,

R11, R12, A1 and A2 have the same definitions as in Chemical Formula 1.

In one embodiment of the present specification, in Chemical Formula 1-2, A1 and A2 are each fluorine.

In one embodiment of the present specification, in Chemical Formula 1-2, A1 and A2 are each chlorine.

In one embodiment of the present specification, the first unit may be represented by the following Chemical Formula 1-2-1 or 1-2-2.

[Chemical Formula 1-1]

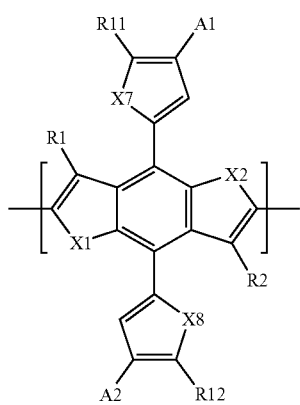

[Chemical Formula 1-2-1]

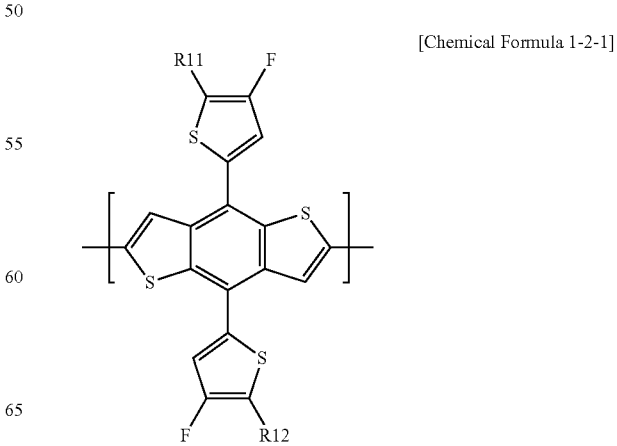

[Chemical Formula 1-2-2]

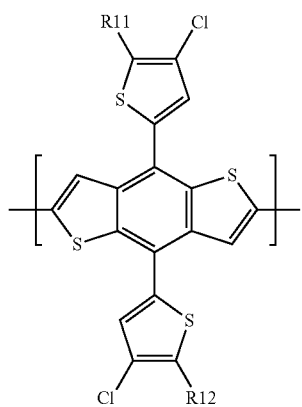

In one embodiment of the present specification, the second unit may be represented by the following Chemical Formula 2-1.

[Chemical Formula 2-1]

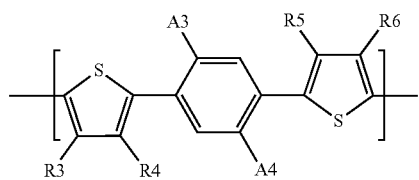

In Chemical Formula 2-1,

R3 to R6, A3 and A4 have the same definitions as in Chemical Formula 2.

In one embodiment of the present specification, the third unit may be represented by any one of the following Chemical Formulae 3-1 to 3-3.

[Chemical Formula 3-1]

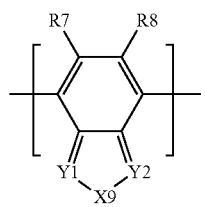

[Chemical Formula 3-2]

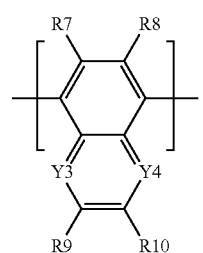

[Chemical Formula 3-3]

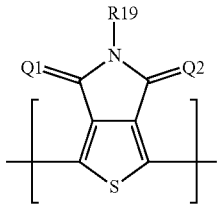

In Chemical Formulae 3-1 to 3-3,

R7, R8, Q1 and Q2 have the same definitions as in Chemical Formulae 3 and 4,

X9 is CRR', NR, O, SiRR', PR, S, GeRR', Se or Te,

Y1 to Y4 are the same as or different from each other, and each independently CR'', N, P or GeR'', and R, R', R'', R9, R10 and R19 are the same as or different from each other, and each independently hydrogen; a substituted or unsubstituted alkyl group; a substituted or unsubstituted alkoxy group; a substituted or unsubstituted alkylthio group; a substituted or unsubstituted aryloxy group; a substituted or unsubstituted arylthio group; a substituted or unsubstituted aryl group; or a substituted or unsubstituted heterocyclic group.

In one embodiment of the present specification, X9 is S.

In one embodiment of the present specification, X9 is Se.

In one embodiment of the present specification, X9 is NR, and R is a substituted or unsubstituted alkyl group.

In one embodiment of the present specification, X9 is NR, and R is an alkyl group having 1 to 20 carbon atoms.

In one embodiment of the present specification, X9 is NR, and R is ethylhexyl.

In one embodiment of the present specification, X9 is NR, and R is 2-ethylhexyl.

In one embodiment of the present specification, Y1 to Y4 are each N.

In one embodiment of the present specification, R19 is a substituted or unsubstituted alkyl group.

In one embodiment of the present specification, R19 is an alkyl group having 1 to 30 carbon atoms.

In one embodiment of the present specification, R19 is an alkyl group having 1 to 15 carbon atoms.

In one embodiment of the present specification, R19 is ethylhexyl.

In one embodiment of the present specification, R19 is 2-ethylhexyl.

In one embodiment of the present specification, R9 and R10 are each a substituted or unsubstituted aryloxy group.

In one embodiment of the present specification, R9 and R10 are each a substituted or unsubstituted (octyloxy)phenyl.

In one embodiment of the present specification, R9 and R10 are each an alkyl group having 1 to 20 carbon atoms.

In one embodiment of the present specification, R9 and R10 are each an alkyl group having 5 to 15 carbon atoms.

In one embodiment of the present specification, R9 and R10 are each octyl.

In one embodiment of the present specification, the third unit may be represented by any one of the following Chemical Formulae 3-4 to 3-9.

[Chemical Formula 3-4]

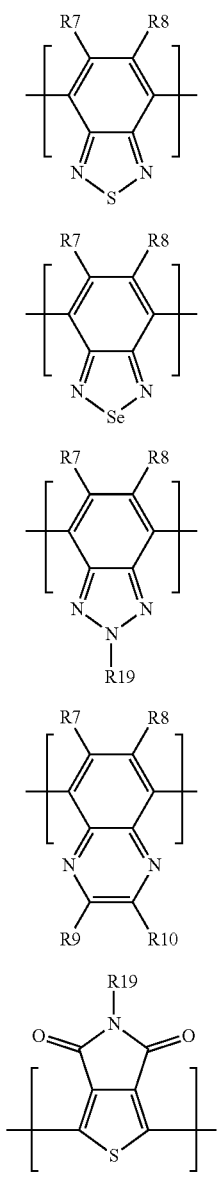

[Chemical Formula 3-5]

[Chemical Formula 3-6]

[Chemical Formula 3-7]

[Chemical Formula 3-8]

[Chemical Formula 3-9]

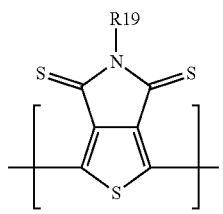

In Chemical Formulae 3-4 to 3-9,

R7 to R10 and R19 have the same definitions as in Chemical Formulae 3-1 to 3-3.

In one embodiment of the present specification, the polymer may include a unit represented by the following Chemical Formula 5.

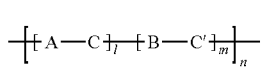

[Chemical Formula 5]

In Chemical Formula 5, l is, as a mole fraction, a real number of 0<l<1, m is, as a mole fraction, a real number of 0<m<1, l+m=1, A is the first unit represented by Chemical Formula 1, B is the second unit represented by Chemical Formula 2, C and C' are the same as or different from each other, and each independently the third unit represented by Chemical Formula 3 or Chemical Formula 4, and n is, as a repetition number of the unit, an integer of 1 to 10,000.

In one embodiment of the present specification, the polymer may include a unit represented by the following Chemical Formula 5-1 or 5-2.

[Chemical Formula 5-1]

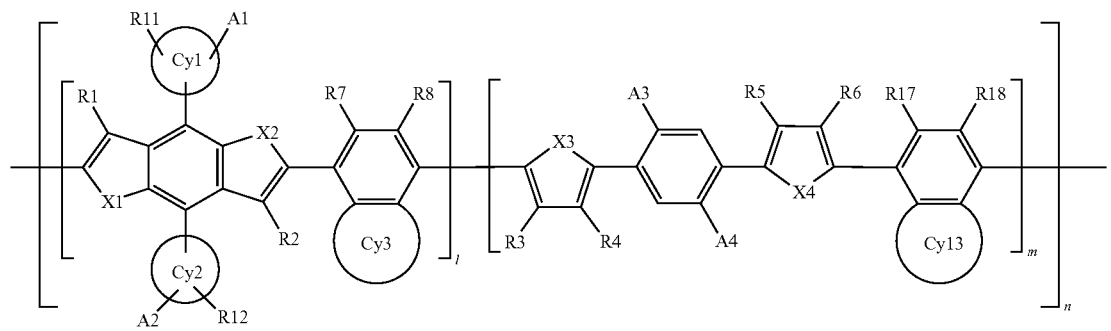

[Chemical Formula 5-2]

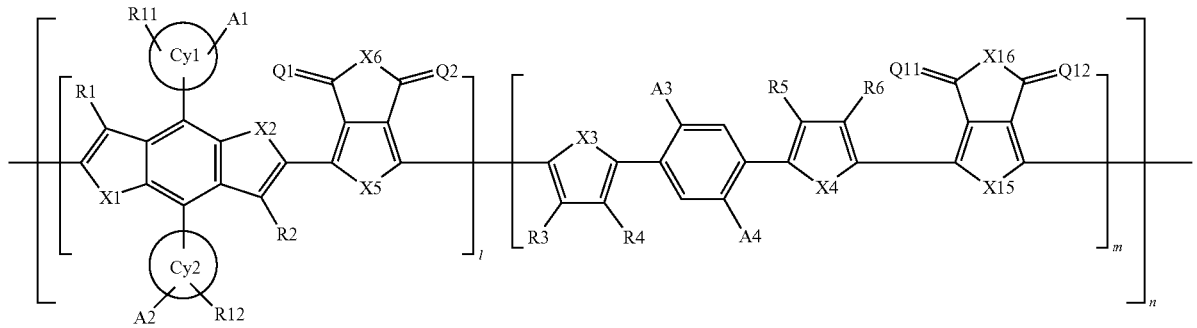

In Chemical Formulae 5-1 and 5-2,

X1 to X6, A1 to A4, Cy1 to Cy3, Q1, Q2, R, R', R", R1 to R8, R11 and R12 have the same definitions as in Chemical Formulae 1 to 4, l, m and n have the same definitions as in Chemical Formula 5, X15 and X16 are the same as or different from each other, and each independently CRR', NR, O, SiRR', PR, S, GeRR', Se or Te, Cy13 is a substituted or unsubstituted heterocyclic group, Q11 and Q12 are the same as or different from each other, and each independently O or S, and R17 and R18 are the same as or different from each other, and each independently hydrogen; deuterium; a halogen group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthio group; a substituted or unsubstituted arylthio group; a substituted or unsubstituted alkylsulfoxy group; a substituted or unsubstituted arylsulfoxy group; a substituted or unsubstituted alkenyl group; a substituted or unsubstituted amine group; a substituted or unsubstituted aryl group; or a substituted or unsubstituted heterocyclic group.

In one embodiment of the present specification, Q11 and Q12 are each O.

In one embodiment of the present specification, Q11 and Q12 are each S.

In one embodiment of the present specification, R17 and R18 are each a substituted or unsubstituted alkoxy group.

In one embodiment of the present specification, R17 and R18 are each an alkoxy group having 1 to 20 carbon atoms.

In one embodiment of the present specification, R17 and R18 are each dodecyloxy.

In one embodiment of the present specification, R17 and R18 are each (ethylhexyl)oxy.

In one embodiment of the present specification, R17 and R18 are each (2-ethylhexyl)oxy.

In one embodiment of the present specification, R17 and R18 are each a halogen group.

In one embodiment of the present specification, R17 and R18 are each fluorine.

In one embodiment of the present specification, R17 and R18 are each hydrogen.

In one embodiment of the present specification, Cy13 is a heterocyclic group.

In one embodiment of the present specification, Cy13 is a heterocyclic group substituted with an alkyl group or an aryl group.

In one embodiment of the present specification, Cy13 is a heterocyclic group including S, Se and/or N as a heteroatom.

In one embodiment of the present specification, Cy13 is a pyrazinyl group.

In one embodiment of the present specification, Cy13 is a pyrazinyl group substituted with an alkyl group or an aryl group.

In one embodiment of the present specification, Cy13 is a selenadiazole group.

In one embodiment of the present specification, Cy13 is a 1,2,5-selenadiazolyl group.

In one embodiment of the present specification, Cy13 is a thiadiazolyl group.

In one embodiment of the present specification, Cy13 is a 1,2,5-thiadiazolyl group.

In one embodiment of the present specification, Cy13 is a triazole group.

In one embodiment of the present specification, Cy13 is a triazole group substituted with an alkyl group or an aryl group.

In one embodiment of the present specification, X15 is S.

In one embodiment of the present specification, X16 is NR, and R is an alkyl group having 1 to 20 carbon atoms.

In one embodiment of the present specification, X16 is NR, and R is ethylhexyl.

In one embodiment of the present specification, X16 is NR, and R is 2-ethylhexyl.

In one embodiment of the present specification, the polymer is any one of the following Chemical Formulae 5-3 to 5-9.

[Chemical Formula 5-3]
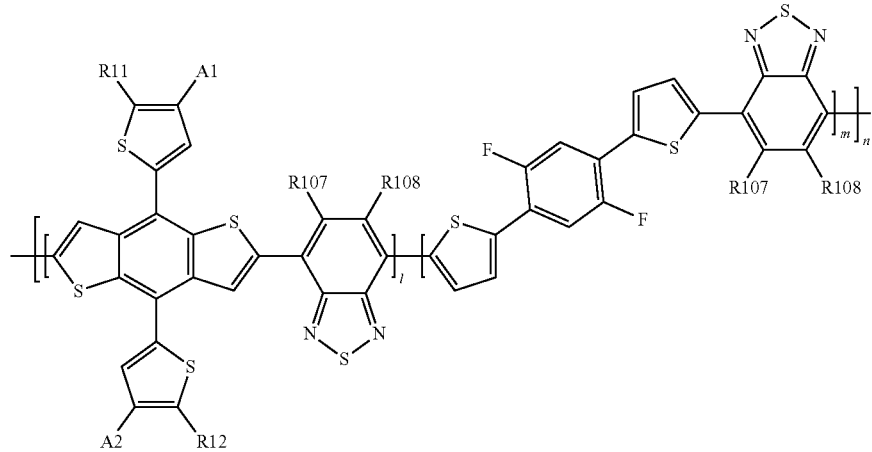
[Chemical Formula 5-4]
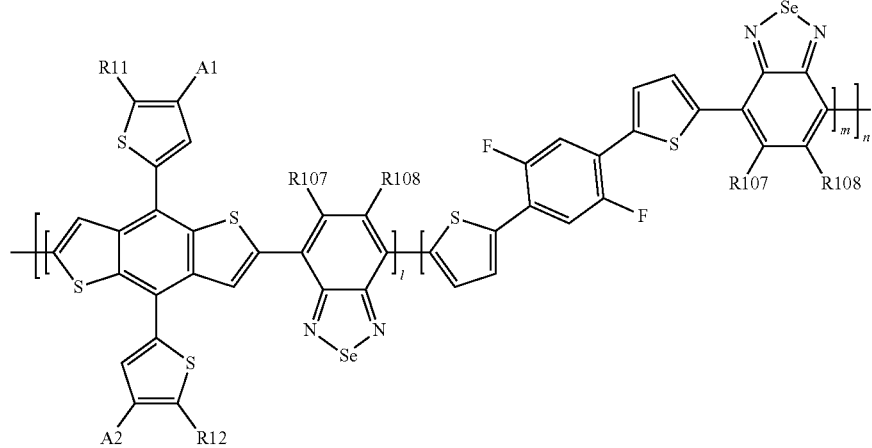
[Chemical Formula 5-5]
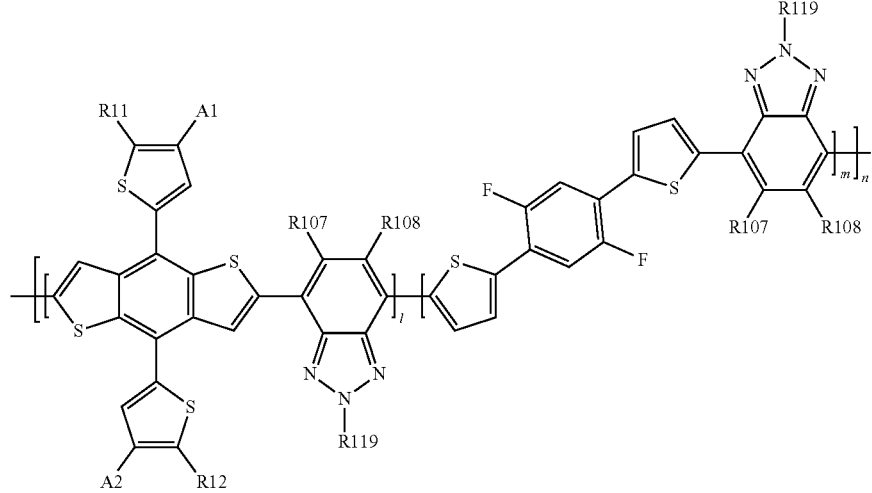

[Chemical Formula 5-6]
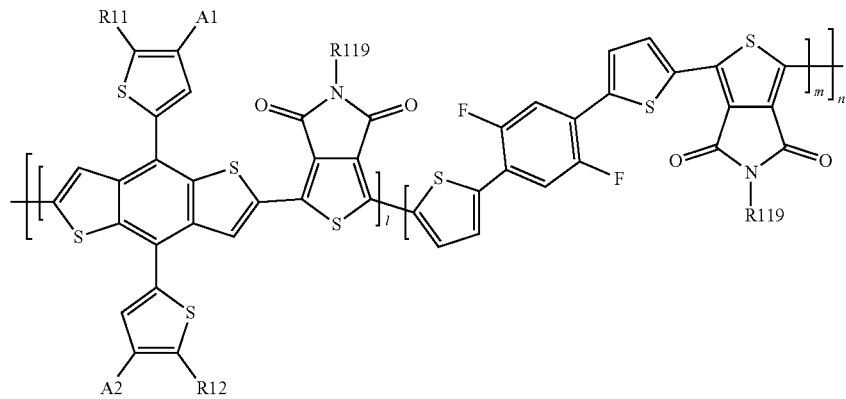
[Chemical Formula 5-7]
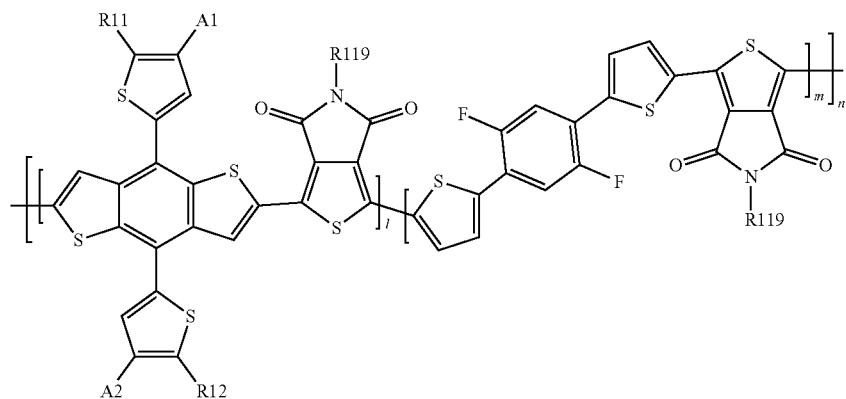
[Chemical Formula 5-8]
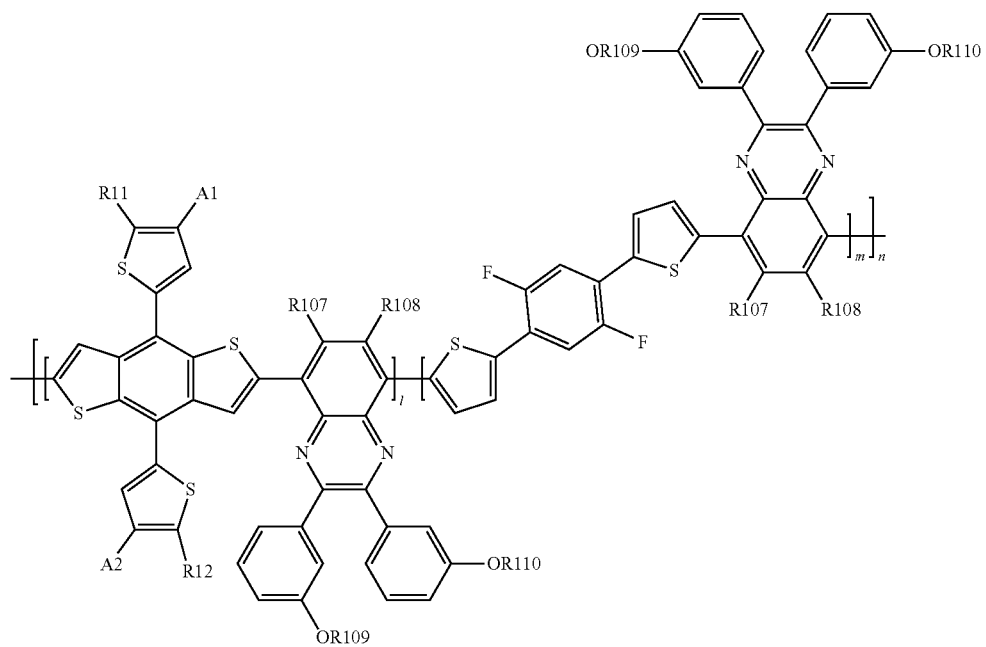

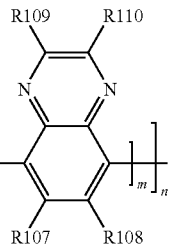

[Chemical Formula 5-9]

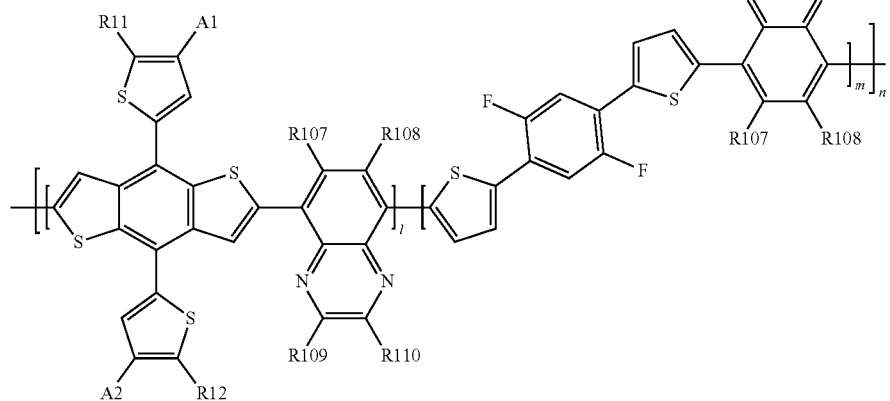

In Chemical Formulae 5-3 to 5-9,

A1, A2, R11 and R12 have the same definitions as in Chemical Formula 1,

R107 and R108 are the same as or different from each other and each hydrogen; a substituted or unsubstituted alkyl group; a substituted or unsubstituted alkoxy group or a halogen group, and R109, R110 and R119 are the same as or different from each other and each hydrogen; or a substituted or unsubstituted alkyl group, l is, as a mole fraction, a real number of 0<l<1, m is, as a mole fraction, a real number of 0<m<1, l+m=1, and n is, as a repetition number of the unit, an integer of 1 to 10,000.

In one embodiment of the present specification, A1 and A2 are each fluorine or chlorine.

In one embodiment of the present specification, R107 and R108 are each an alkyl group having 1 to 30 carbon atoms.

In one embodiment of the present specification, R107 and R108 are each an alkyl group having 5 to 15 carbon atoms.

In one embodiment of the present specification, R107 and R108 are each a dodecyl group.

In one embodiment of the present specification, R107 and R108 are each an octyl group.

In one embodiment of the present specification, R107 and R108 are each an ethylhexyl group.

In one embodiment of the present specification, R107 and R108 are each a 2-ethylhexyl group.

In one embodiment of the present specification, R107 and R108 are each an alkoxy group having 1 to 30 carbon atoms.

In one embodiment of the present specification, R107 and R108 are each an alkoxy group having 5 to 15 carbon atoms.

In one embodiment of the present specification, R107 and R108 are each a (dodecyl)oxy group.

In one embodiment of the present specification, R107 and R108 are each an (octyl)oxy group.

In one embodiment of the present specification, R107 and R108 are each an (ethylhexyl)oxy group.

In one embodiment of the present specification, R107 and R108 are each a (2-ethylhexyl)oxy group.

In one embodiment of the present specification, R107 and R108 are each fluorine.

In one embodiment of the present specification, R107 and R108 are each hydrogen.

In one embodiment of the present specification, R109 and R110 are each an alkyl group having 1 to 30 carbon atoms.

In one embodiment of the present specification, R109 and R110 are each an alkyl group having 5 to 15 carbon atoms.

In one embodiment of the present specification, R109 and R110 are each an octyl group.

In one embodiment of the present specification, R119 is an alkyl group having 1 to 30 carbon atoms.

In one embodiment of the present specification, R119 is an alkyl group having 1 to 15 carbon atoms.

In one embodiment of the present specification, R119 is an ethylhexyl group.

In one embodiment of the present specification, R119 is a 2-ethylhexyl group.

In one embodiment of the present specification, the polymer may be any one of the following Chemical Formulae 6-1 to 6-30.

[Chemical Formula 6-1]
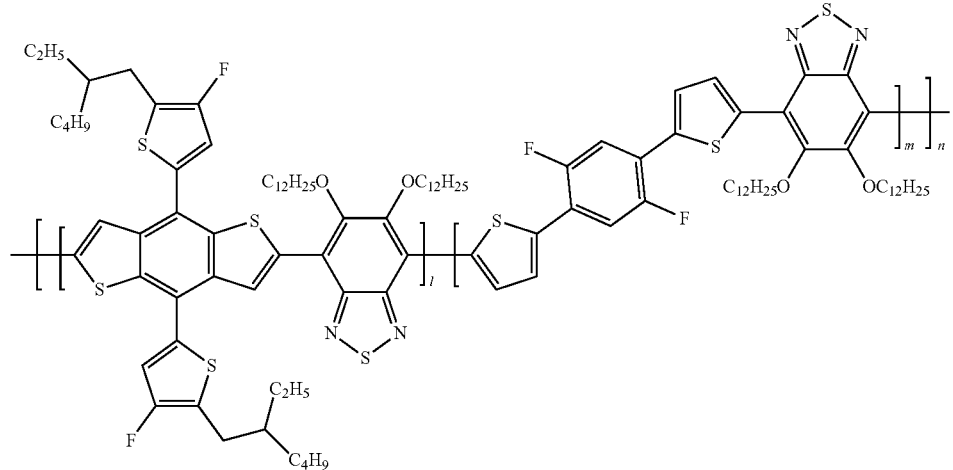
[Chemical Formula 6-2]
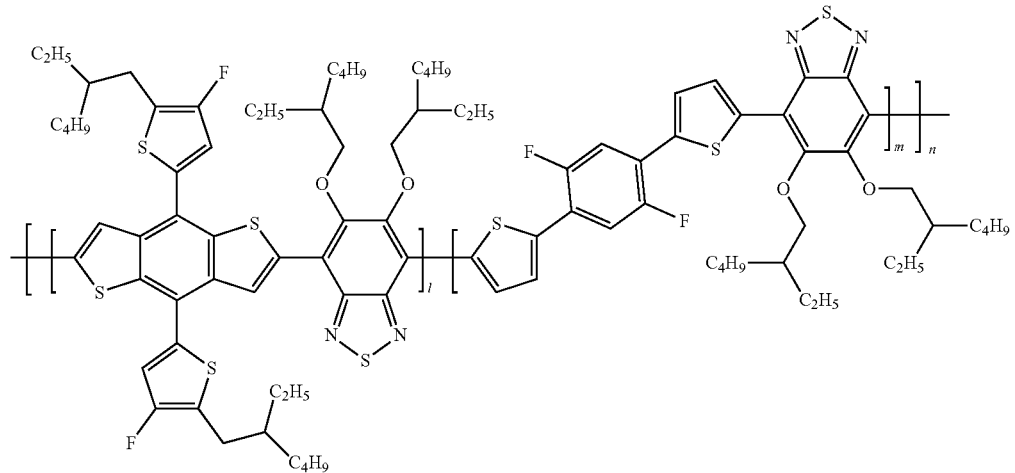
[Chemical Formula 6-3]
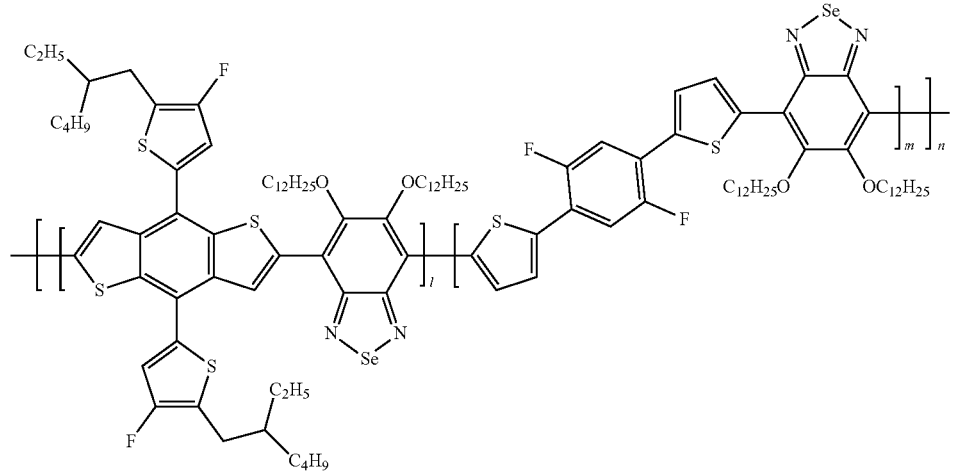

[Chemical Formula 6-4]
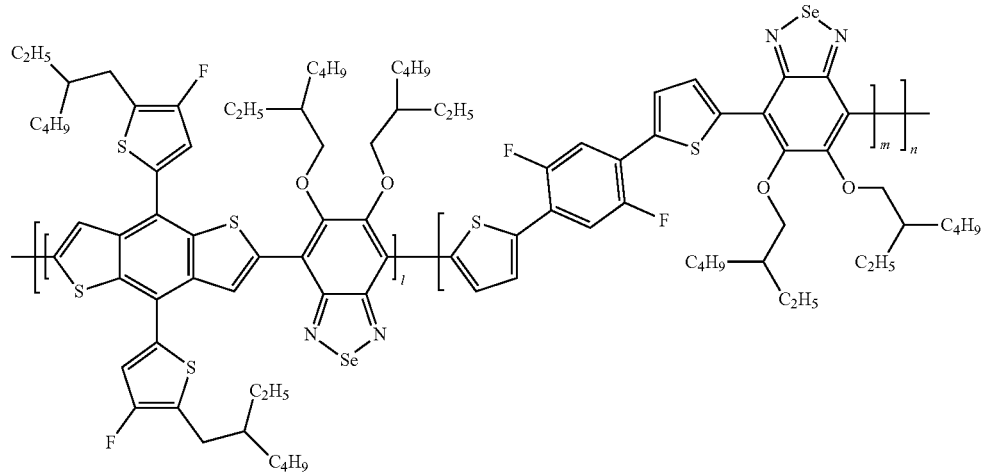
[Chemical Formula 6-5]
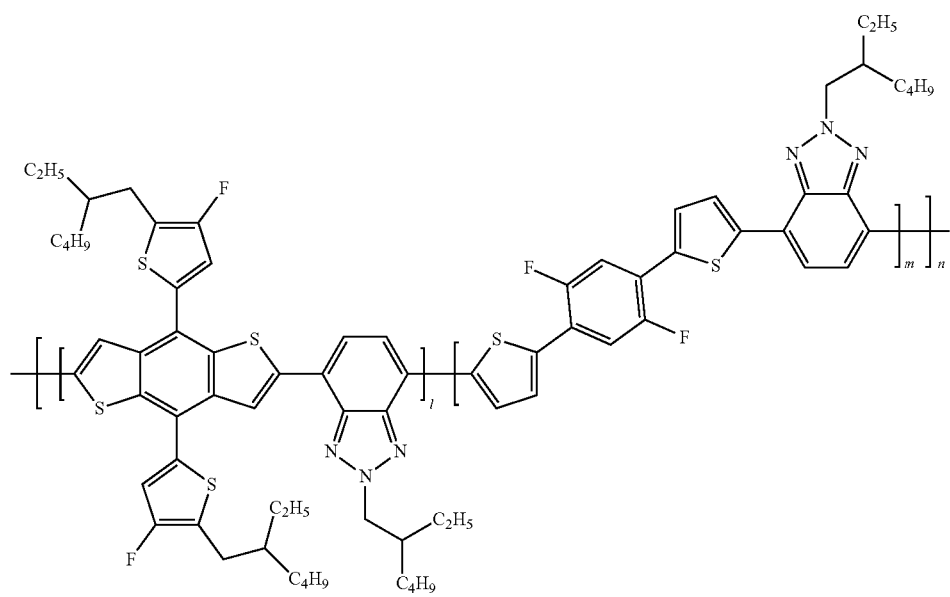

[Chemical Formula 6-6]
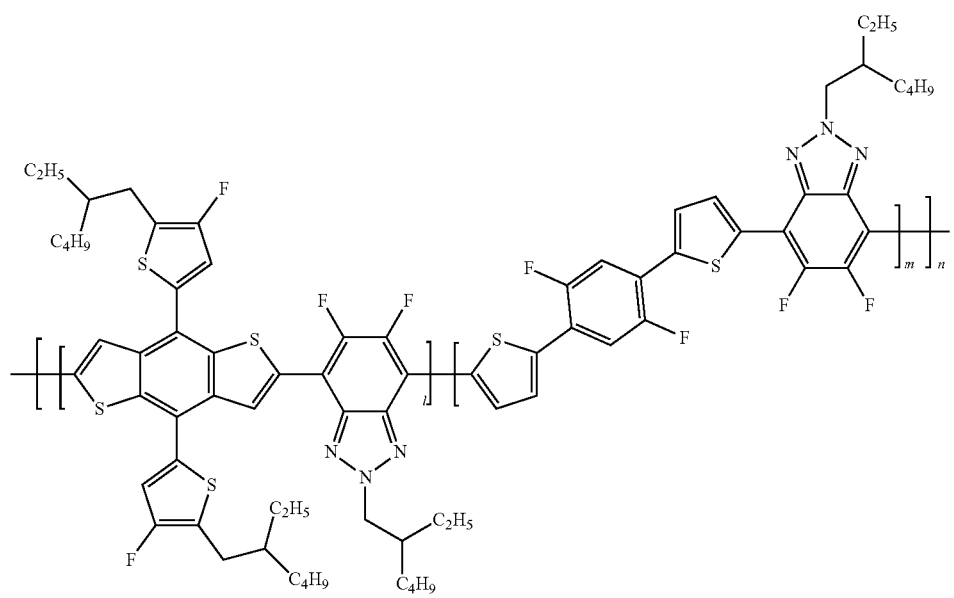
[Chemical Formula 6-7]
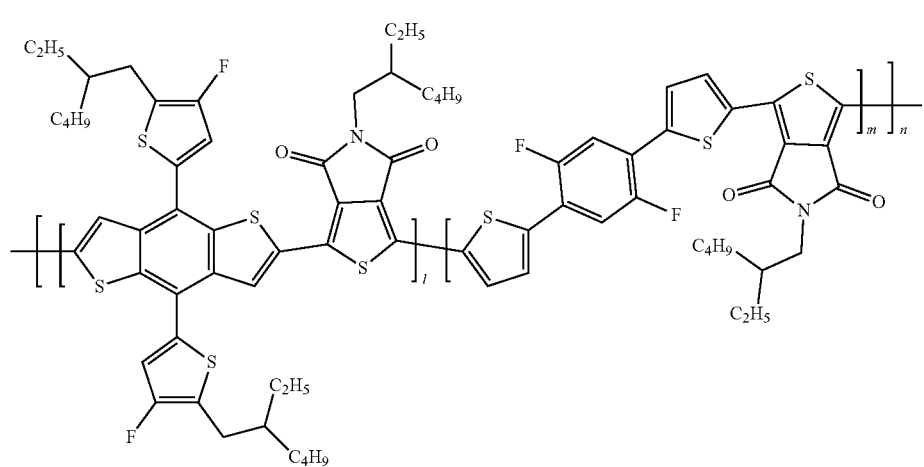
[Chemical Formula 6-8]
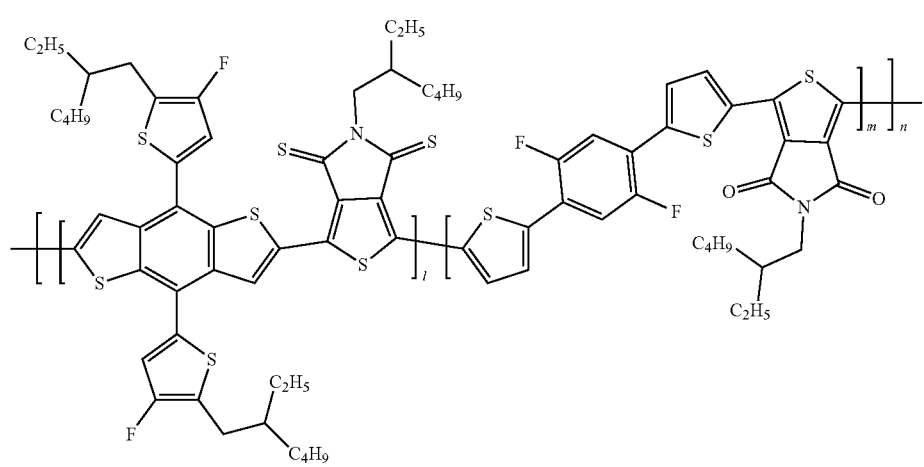

[Chemical Formula 6-9]
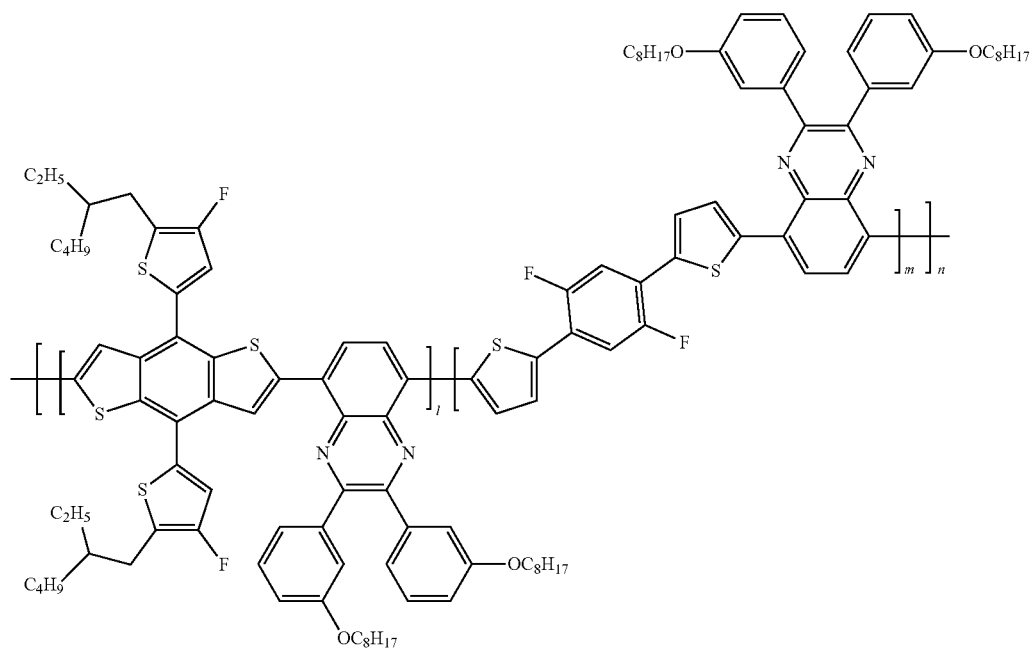
[Chemical Formula 6-10]
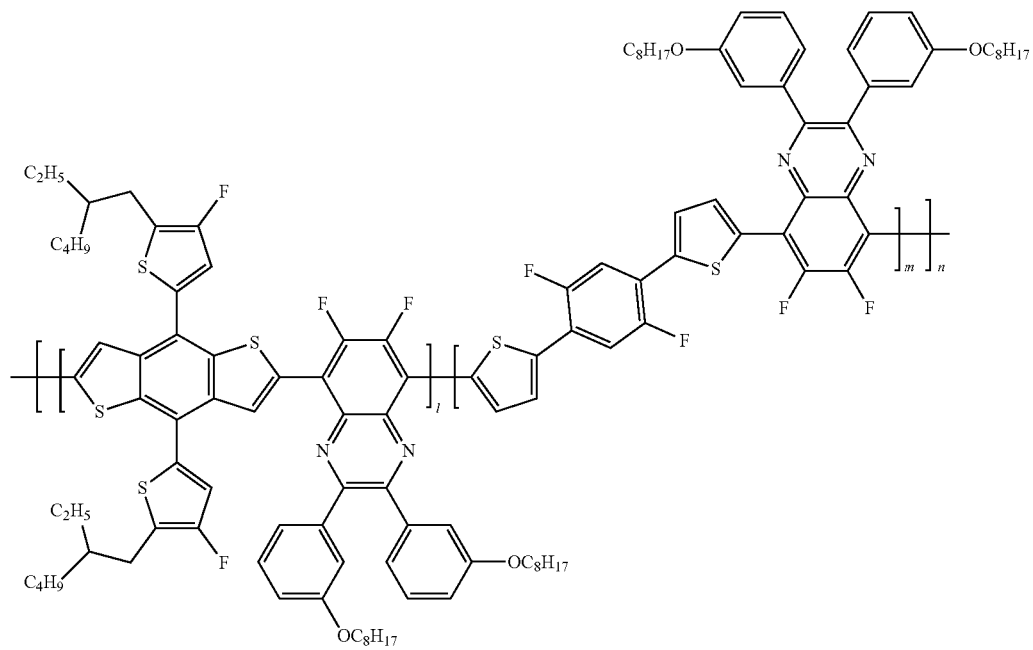

[Chemical Formula 6-11]
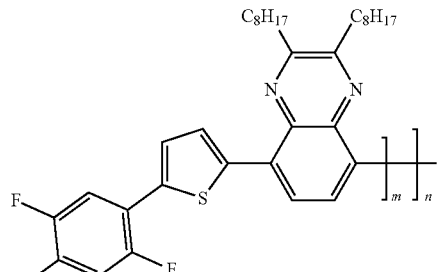
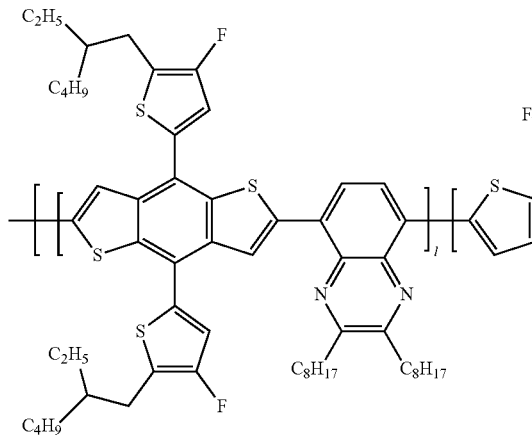
[Chemical Formula 6-12]
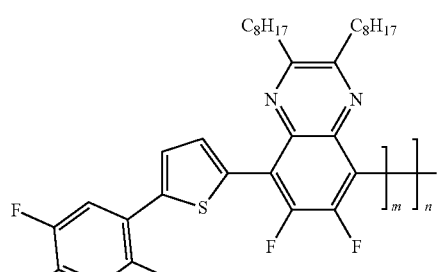
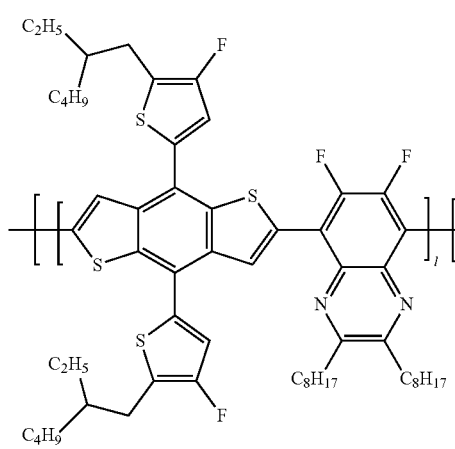
[Chemical Formula 6-13]
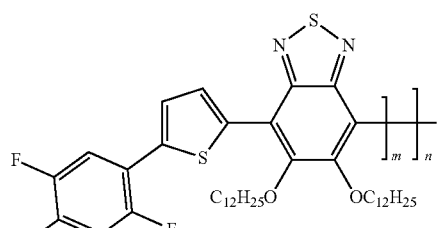
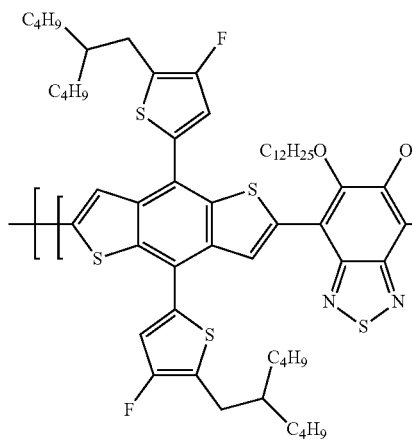

[Chemical Formula 6-14]
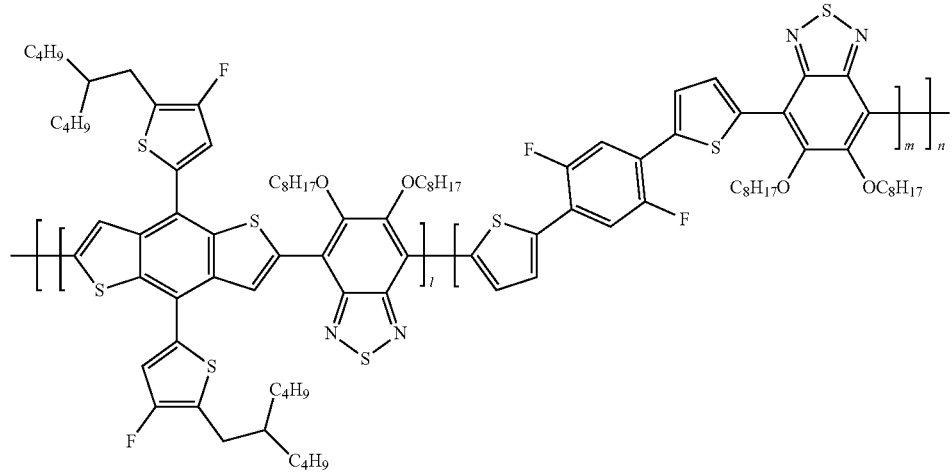
[Chemical Formula 6-15]
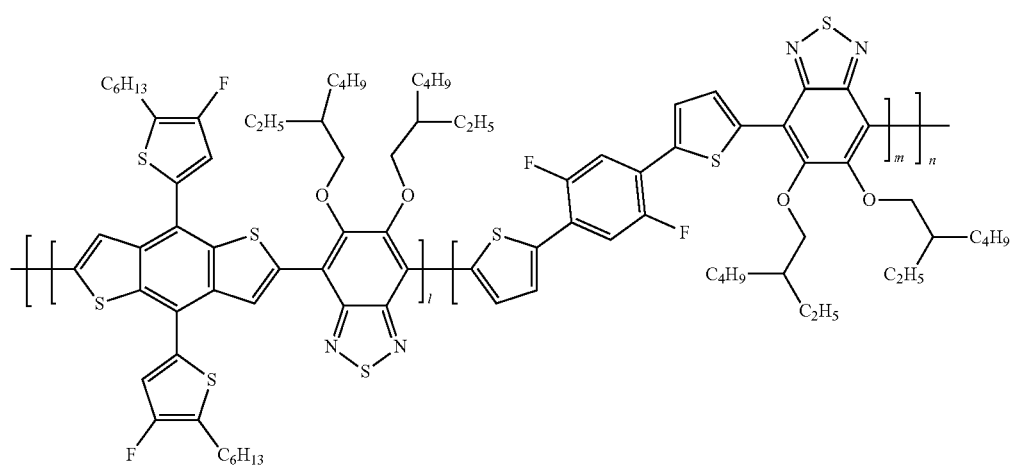
[Chemical Formula 6-16]
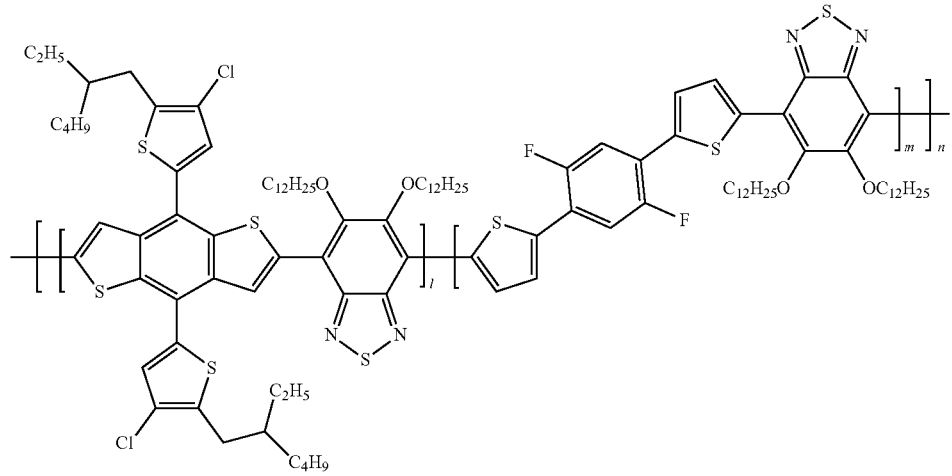

[Chemical Formula 6-17]
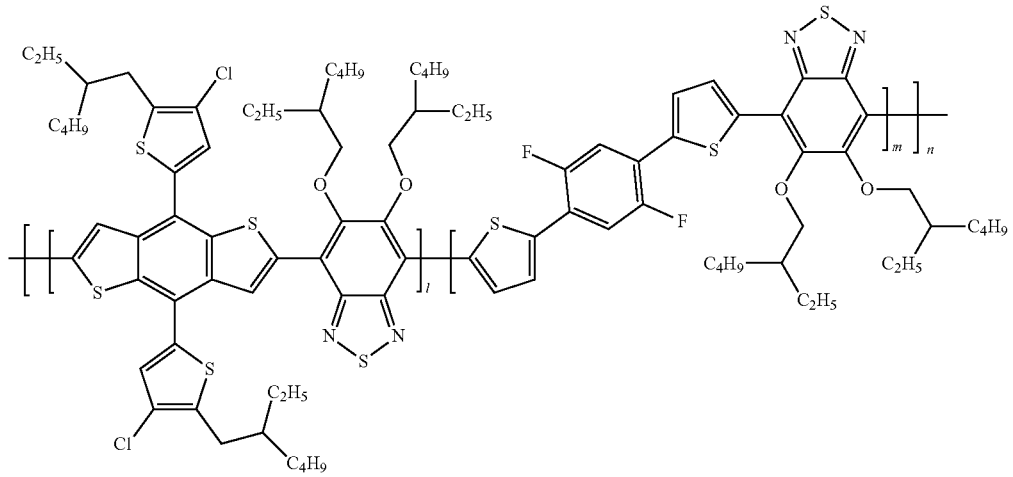
[Chemical Formula 6-18]
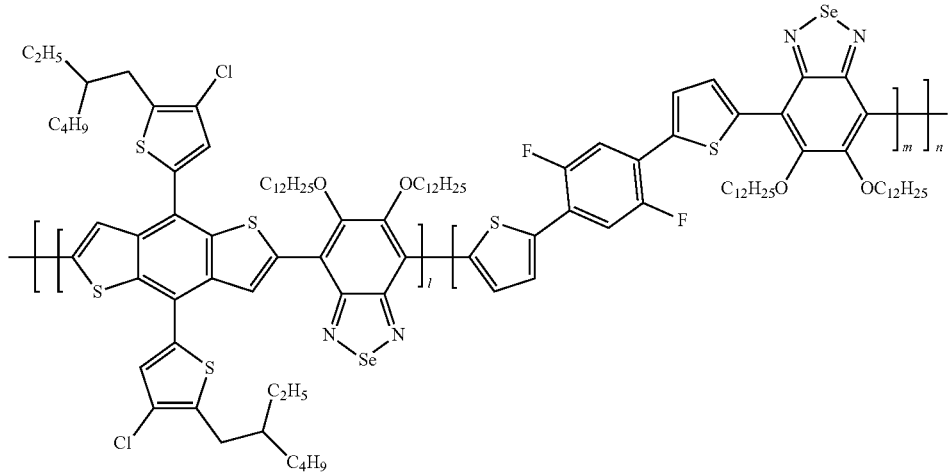
[Chemical Formula 6-19]
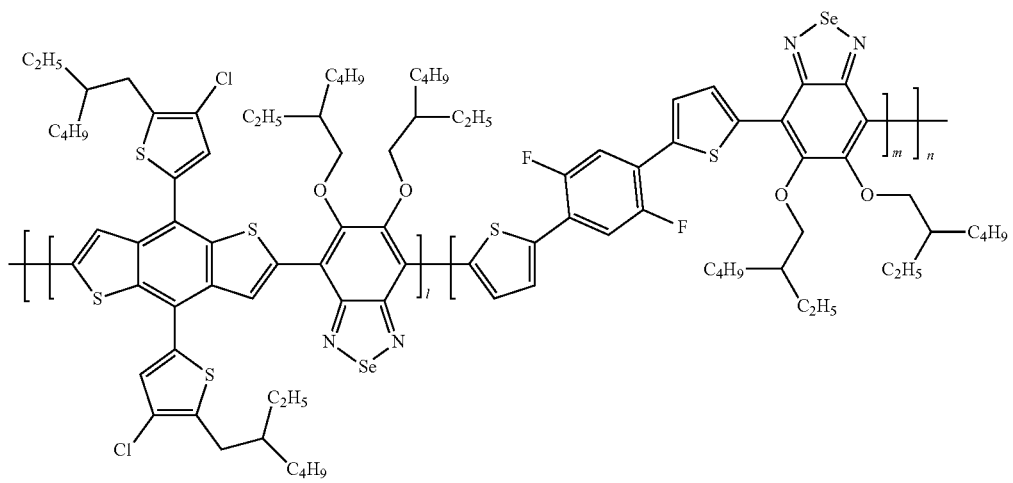

[Chemical Formula 6-20]
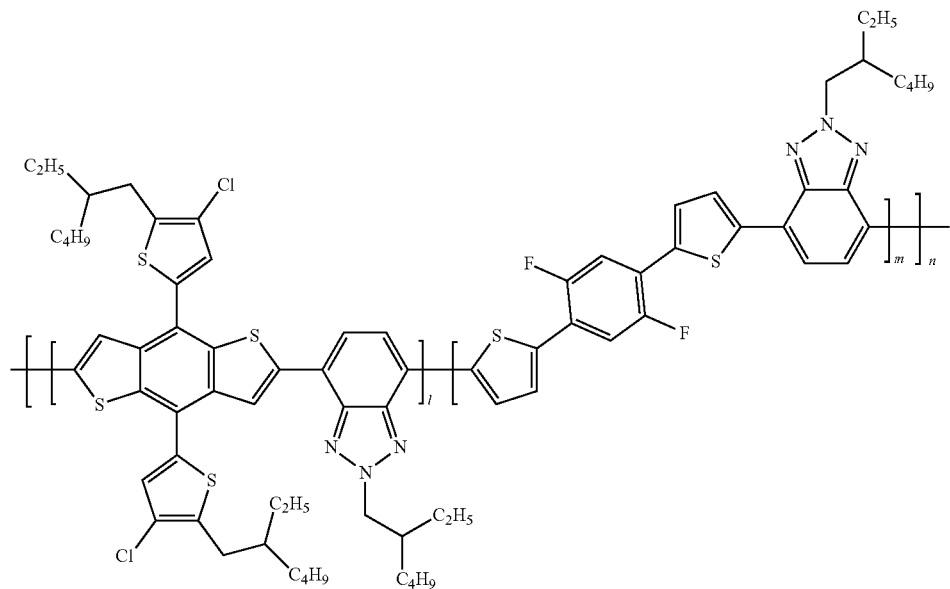
[Chemical Formula 6-21]
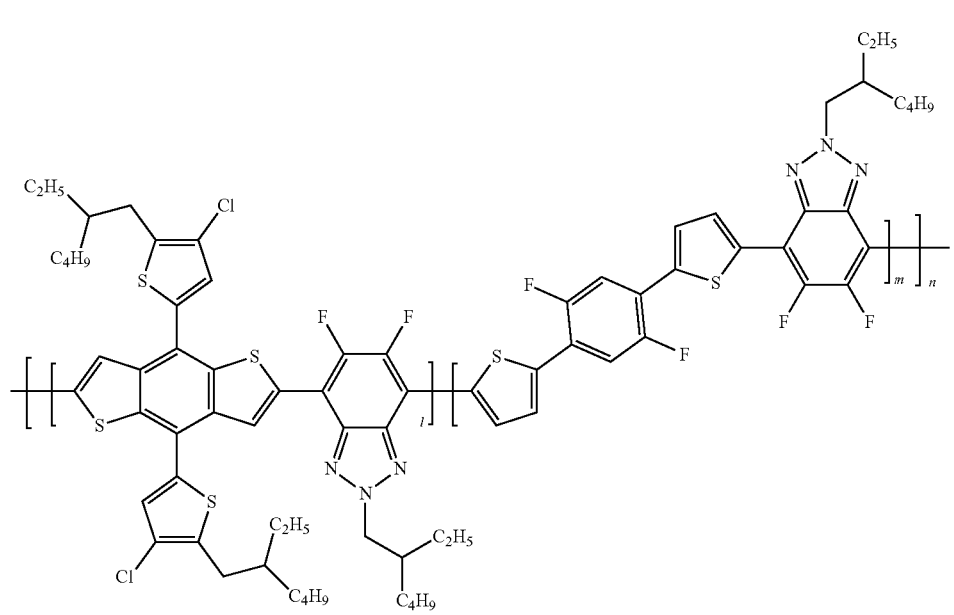
[Chemical Formula 6-22]
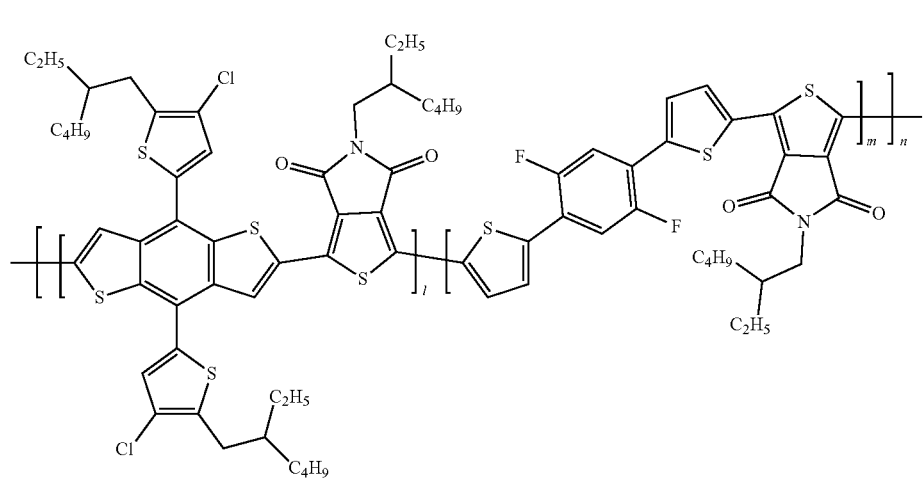

[Chemical Formula 6-23]
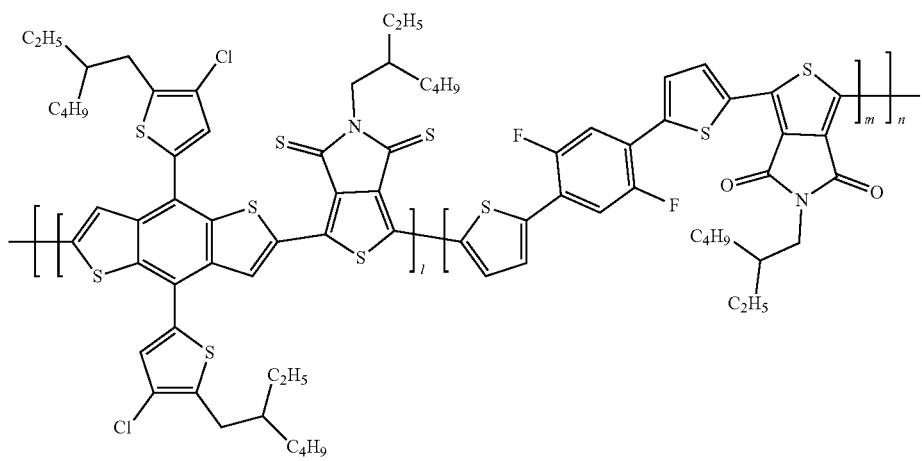
[Chemical Formula 6-24]
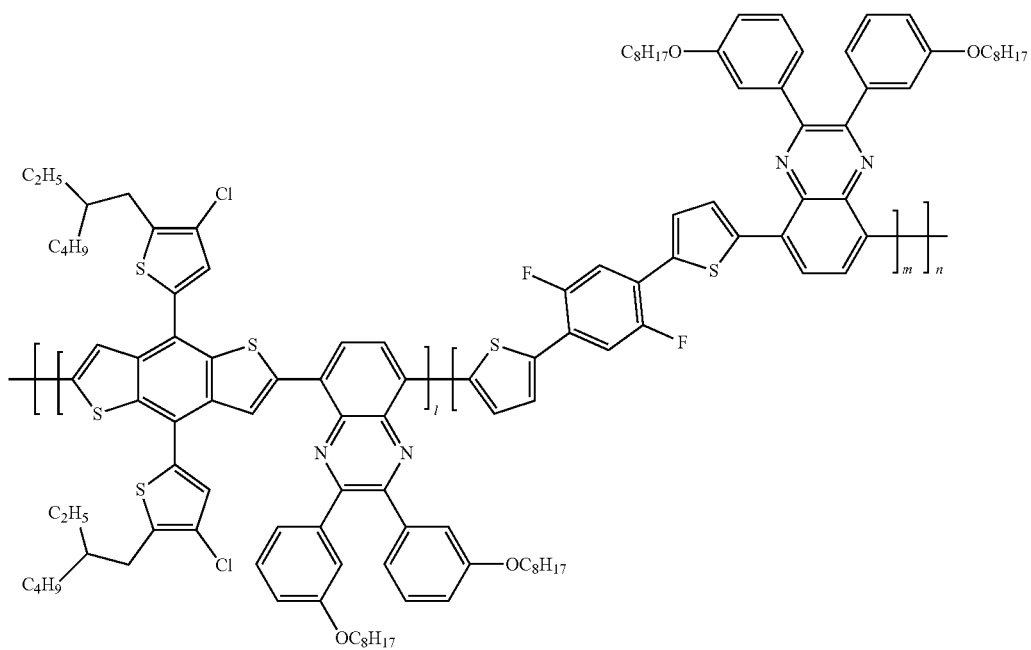

[Chemical Formula 6-25]
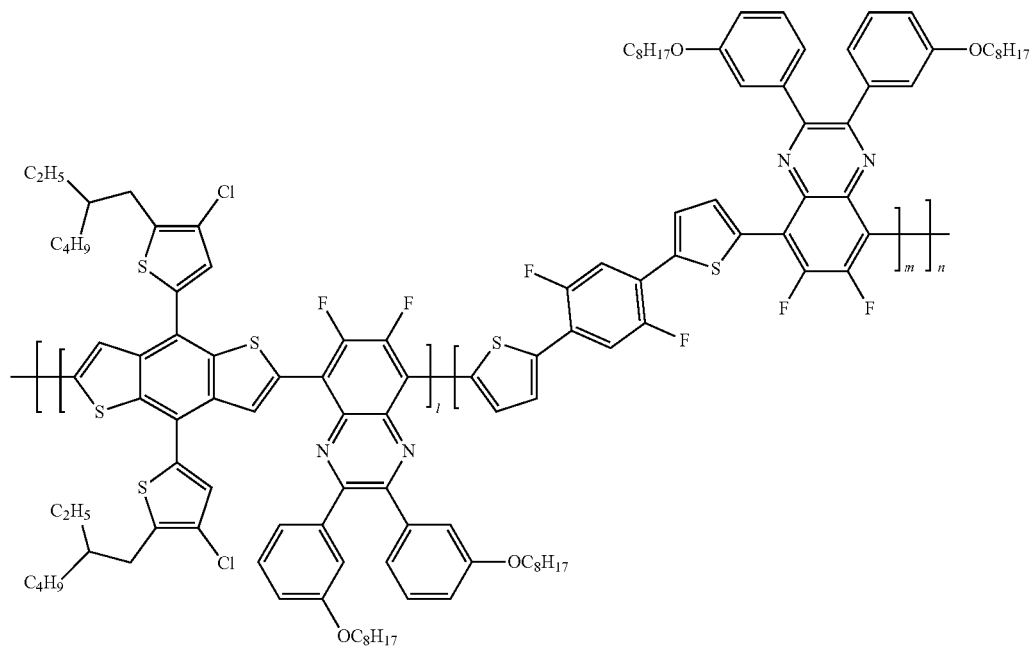
[Chemical Formula 6-26]
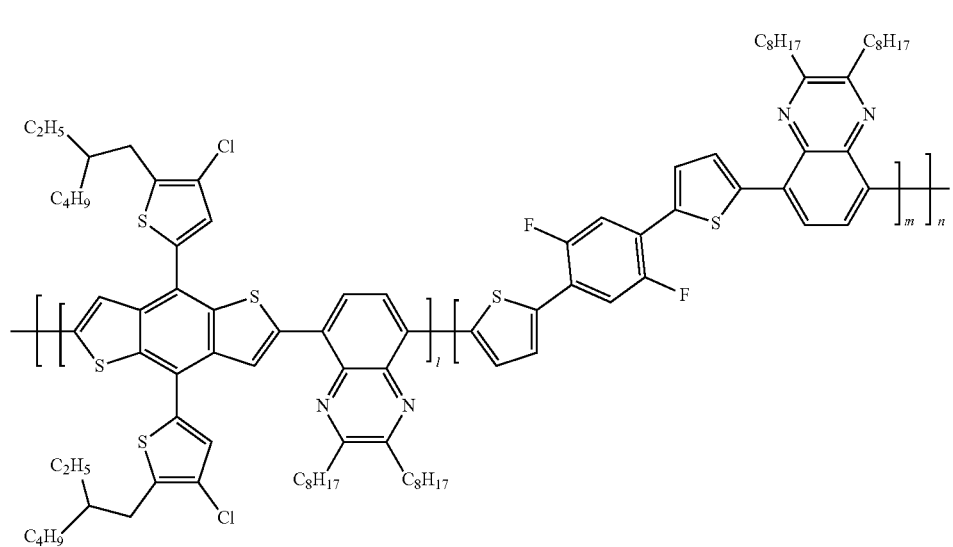

-continued
[Chemical Formula 6-27]
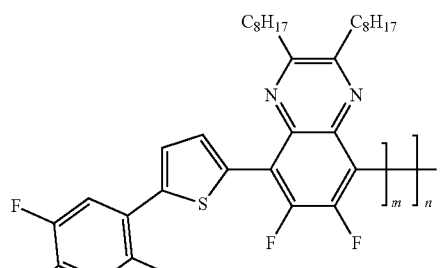
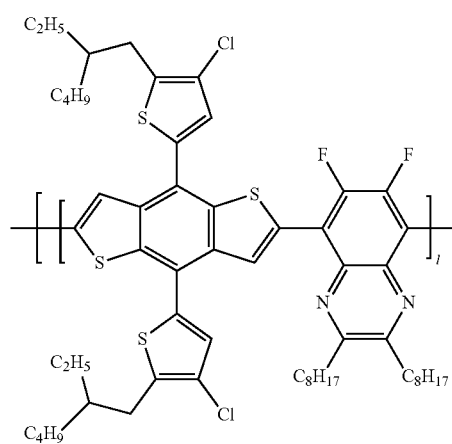
[Chemical Formula 6-28]
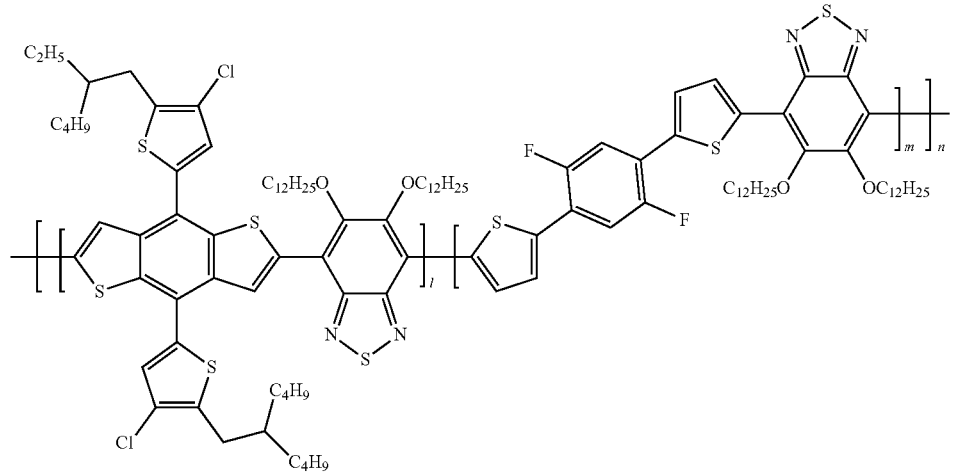
[Chemical Formula 6-29]
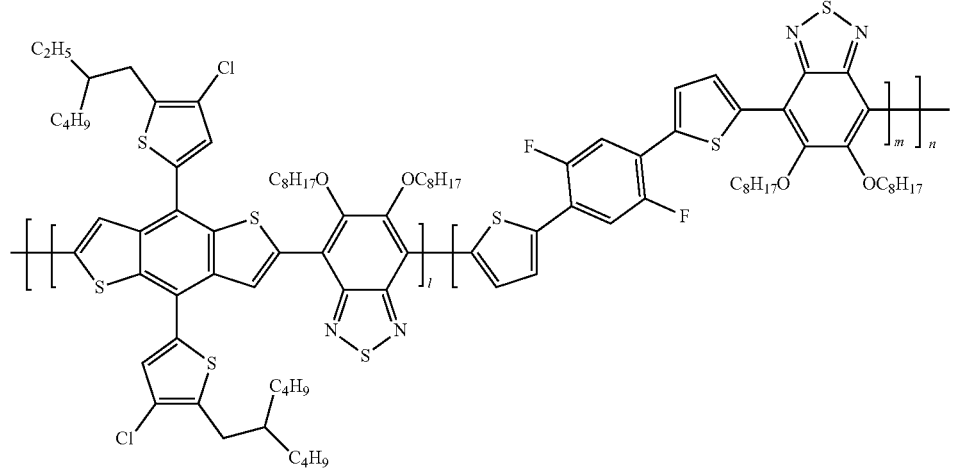

[Chemical Formula 6-30]
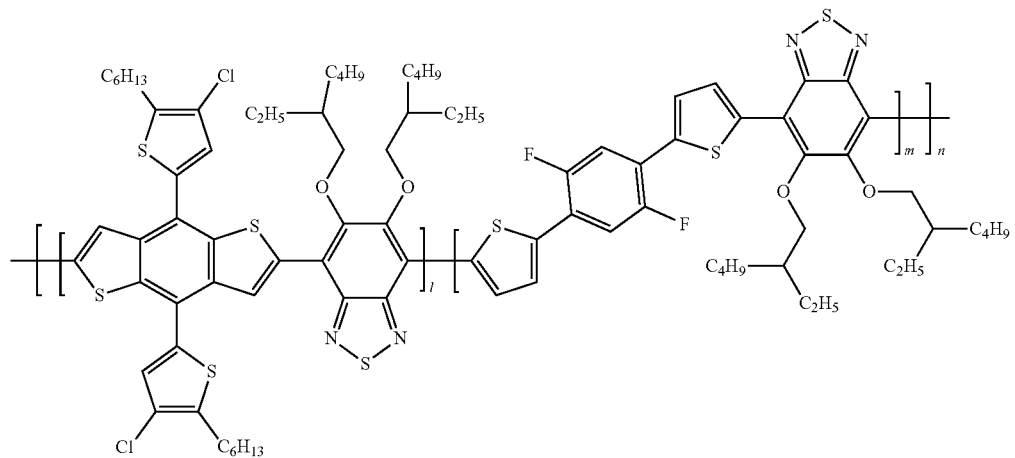
[Chemical Formula 6-6]
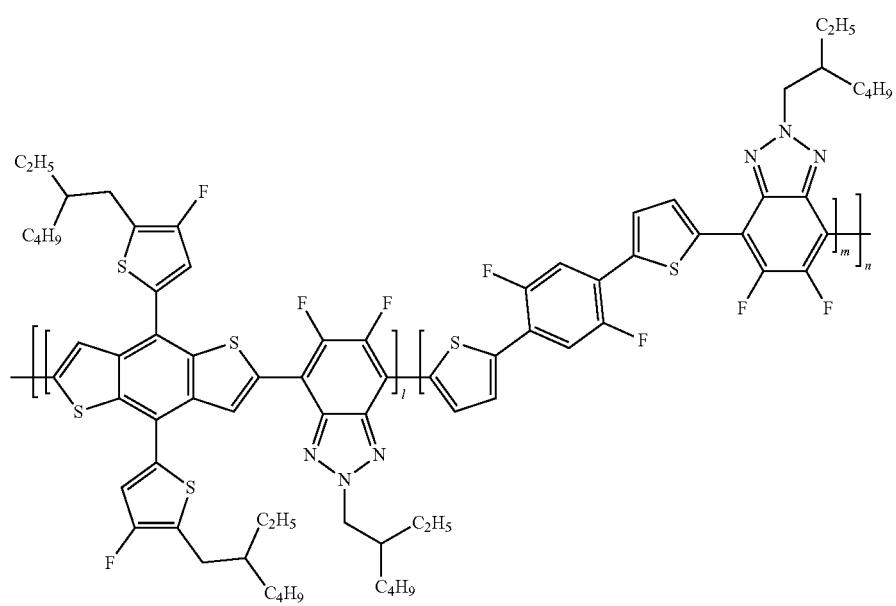

[Chemical Formula 6-21]

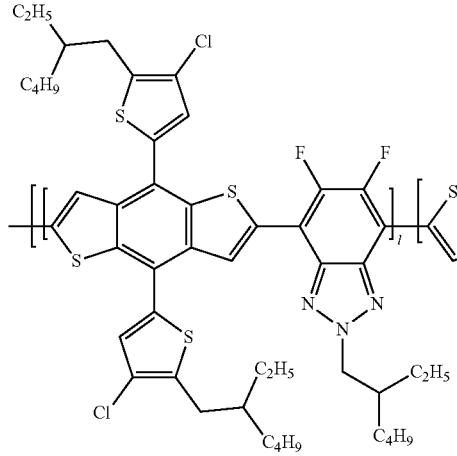
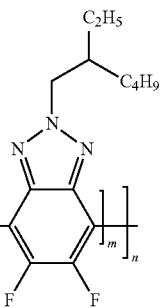

In Chemical Formulae 6-1 to 6-30, l is, as a mole fraction, a real number of $0<l<1$, m is, as a mole fraction, a real number of $0<m<1$, $l+m=1$, and n is, as a repetition number of the unit, an integer of 1 to 10,000.

In one embodiment of the present specification, l and m are each 0.5.

One embodiment of the present specification provides an organic solar cell including a first electrode; a second electrode disposed opposite to the first electrode; and one or more organic material layers disposed between the first electrode and the second electrode and including a photoactive layer, wherein the photoactive layer includes the polymer.

In one embodiment of the present specification, the photoactive layer includes an electron donor and an electron acceptor, and the electron donor includes the polymer.

In one embodiment of the present specification, the electron acceptor includes a non-fullerene-based compound.

In one embodiment of the present specification, the non-fullerene-based compound may be represented by the following Chemical Formula A.

In Chemical Formula A,

Ra to Rf are the same as or different from each other, and each independently hydrogen; or a substituted or unsubstituted alkyl group, La to Ld are the same as or different from each other, and each independently a substituted or unsubstituted arylene group; or a substituted or unsubstituted divalent heterocyclic group, Ma and Mb are the same as or different from each other, and each independently a halogen group; or a substituted or unsubstituted alkyl group, p and q are the same as or different from each other, and each independently an integer of 0 to 2, and when p or q is 2, structures in the parentheses are the same as each other.

In one embodiment of the present specification, Ra to Rd are each an alkyl group.

In one embodiment of the present specification, Ra to Rd are each an alkyl group having 1 to 30 carbon atoms.

In one embodiment of the present specification, Ra to Rd are each an alkyl group having 1 to 10 carbon atoms.

In one embodiment of the present specification, Ra to Rd are each hexyl.

[Chemical Formula A]

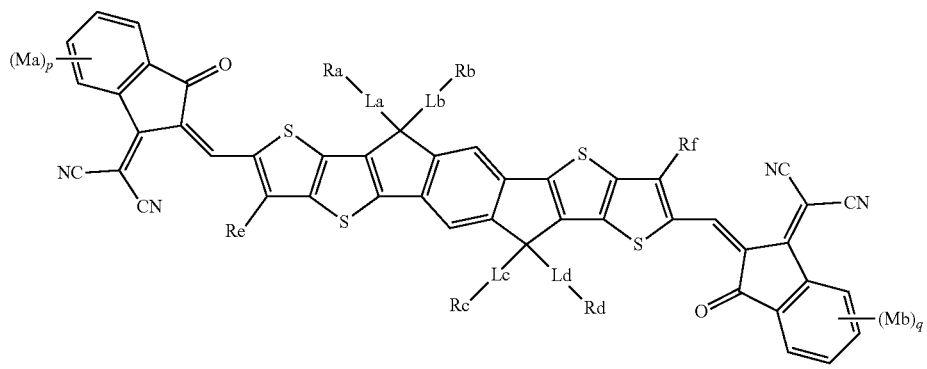

In one embodiment of the present specification, Re and Rf are each hydrogen.

In one embodiment of the present specification, La to Ld are each an arylene group.

In one embodiment of the present specification, La to Ld are each an arylene group having 6 to 25 carbon atoms.

In one embodiment of the present specification, La to Ld are each a phenylene group.

In one embodiment of the present specification, Ma and Mb are each hydrogen.

In one embodiment of the present specification, Ma and Mb are each an alkyl group.

In one embodiment of the present specification, Ma and Mb are each an alkyl group having 1 to 10 carbon atoms.

In one embodiment of the present specification, Ma and Mb are each a methyl group.

In one embodiment of the present specification, Ma and Mb are each a halogen group.

In one embodiment of the present specification, Ma and Mb are each fluorine.

In one embodiment of the present specification, p and q are each 0.

In one embodiment of the present specification, p and q are each 1.

In one embodiment of the present specification, p and q are each 2.

In one embodiment of the present specification, the electron acceptor may be any one of the following Chemical Formulae A-1 to A-6.

[Chemical Formula A-1]

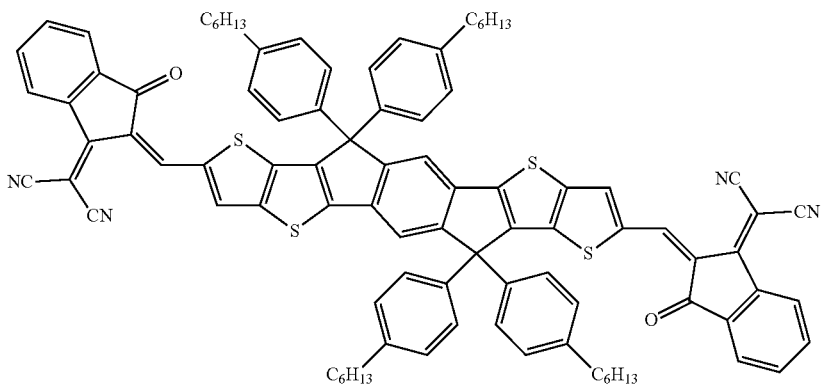

[Chemical Formula A-2]

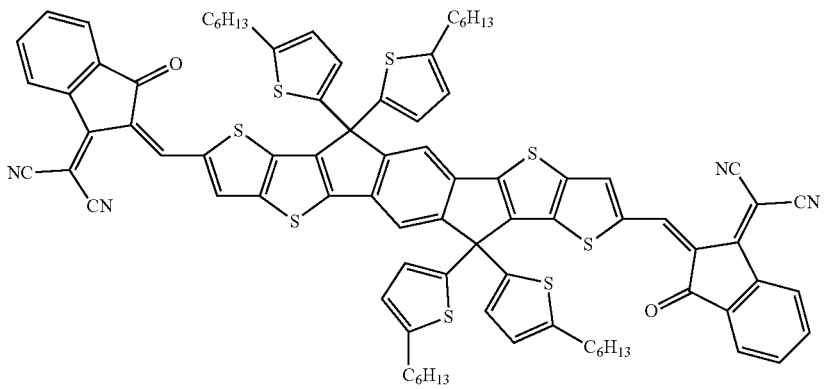

[Chemical Formula A-3]

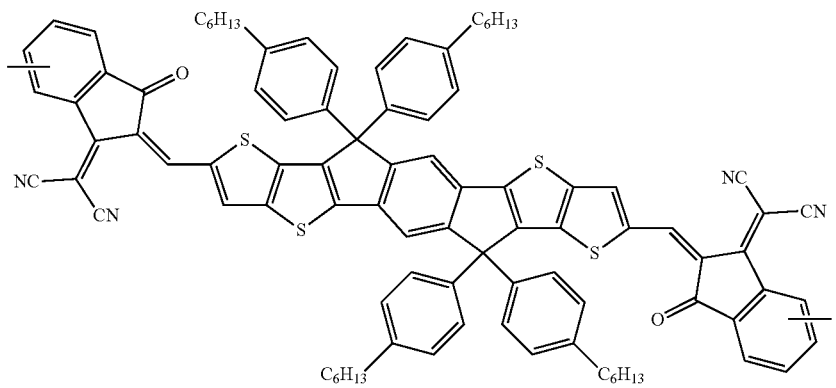

[Chemical Formula A-4]

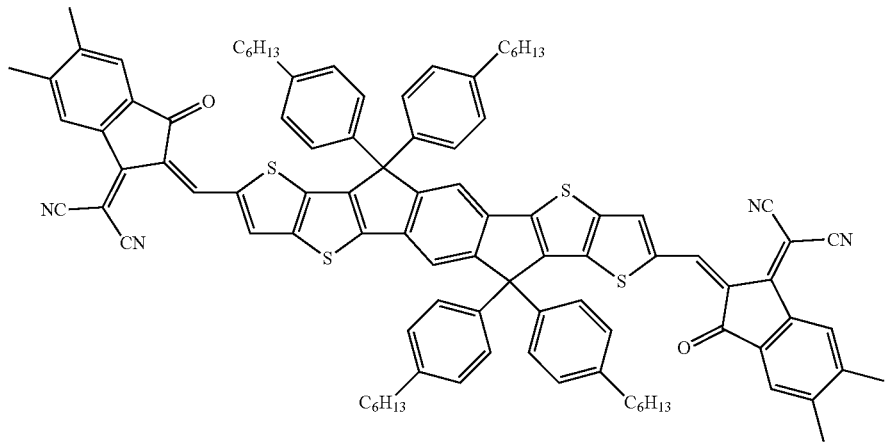

[Chemical Formula A-5]

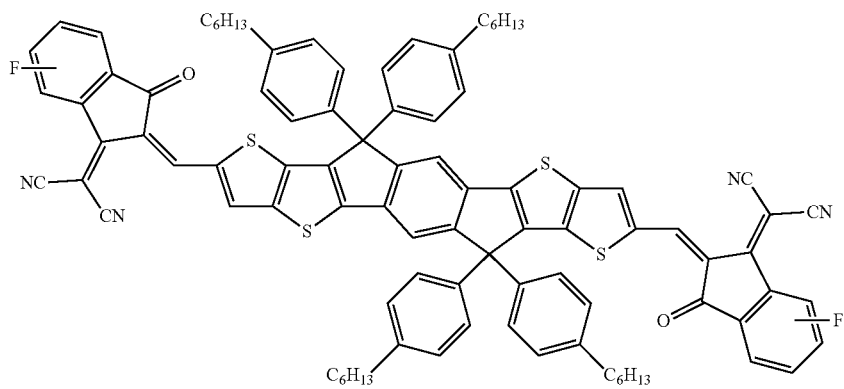

[Chemical Formula A-6]

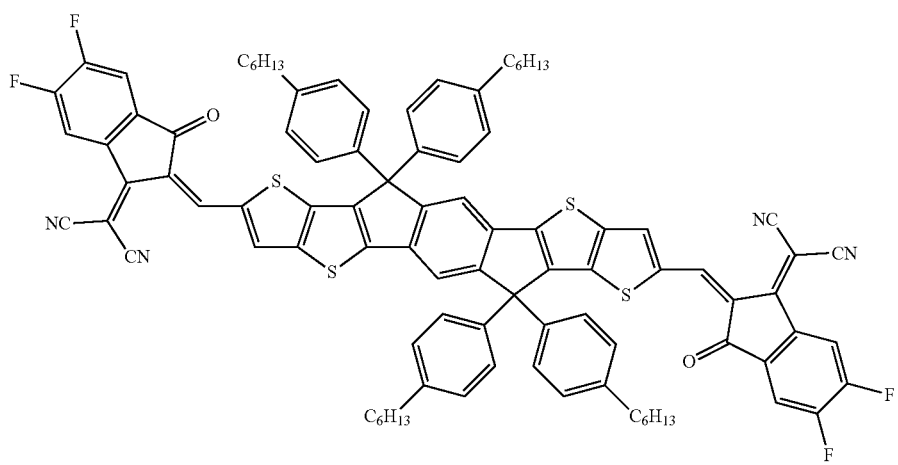

In one embodiment of the present specification, the non-fullerene-based compound has higher thermal stability compared to fullerene-based compounds.

In one embodiment of the present specification, the electron donor is a polymer including the unit represented by Chemical Formula 5-1 or 5-2, and the electron acceptor is the compound represented by Chemical Formula A.

In one embodiment of the present specification, the electron donor and the electron acceptor have a mass ratio of 2:1 to 1:5. The mass ratio is preferably from 1:1 to 1:5 and more preferably from 1:1 to 1:3.

In one embodiment of the present specification, the electron donor and the electron acceptor may form a bulk heterojunction (BHJ). A bulk heterojunction means an electron donor material and an electron acceptor material being mixed together in a photoactive layer.

In one embodiment of the present specification, the electron donor may be a p-type organic material layer, and the electron acceptor may be an n-type organic material layer.

In one embodiment of the present specification, the polymer is a random polymer. In addition, the random polymer has enhanced solubility, which is economically effective in terms of time and costs in a device manufacturing process.

In one embodiment of the present specification, an end group of the polymer is a heterocyclic group or an aryl group.

In one embodiment of the present specification, an end group of the polymer is a 4-(trifluoromethyl)phenyl group.

In one embodiment of the present specification, an end group of the polymer is a bromo-thiophene group.

In one embodiment of the present specification, an end group of the polymer is a trifluoro-benzene group.

In one embodiment of the present specification, the polymer may have its end group being not capped.

In one embodiment of the present specification, the polymer preferably has a number average molecular weight of 5,000 g/mol to 1,000,000 g/mol. The number average molecular weight is preferably 100,000 g/mol or less so as to have solubility at a certain level or higher, which is advantageous in using a solution coating method.

In one embodiment of the present specification, the polymer may have molecular weight distribution of 1 to 10. Preferably, the polymer has molecular weight distribution of 1 to 3. As the molecular weight distribution decreases and the number average molecular weight increases, favorable electrical properties and mechanical properties are obtained.

In one embodiment of the present specification, the molecular weight distribution means a number dividing a weight average molecular weight (Mw) by a number average molecular weight (Mn), that is, weight average molecular weight (Mw)/number average molecular weight (Mn), and the weight average molecular weight (Mw) and the number average molecular weight (Mn) are measured by gel permeation chromatography (GPC) using chlorobenzene as a solvent.

The polymer may be prepared by introducing a monomer of each unit together with $Pd_2(dba)_3$ and $P(o\text{-tolyl})_3$ using chlorobenzene as a solvent and polymerizing the result using a microwave reactor.

The polymer according to the present specification may be prepared using a multi-step chemical reaction. After preparing monomers through an alkylation reaction, a Grignard reaction, a Suzuki coupling reaction, a Stille coupling reaction and the like, final polymers may be prepared through a carbon-carbon coupling reaction such as a Stille coupling reaction. When a substituent to introduce is a boronic acid or a boronic ester compound, a Suzuki coupling reaction may be used, and when a substituent to introduce is a tributyltin or trimethyltin compound, a Stile coupling reaction may be used, however, the method is not limited thereto.

FIG. 1 is a diagram illustrating the organic solar cell according to one embodiment of the present specification, which has structure in which an electron transfer layer (102), a photoactive layer (103), a hole transfer layer (104) and a second electrode (105) are consecutively laminated on a first electrode (101), however, the structure of the organic solar cell of the present specification is not limited thereto.

In one embodiment of the present specification, the organic solar cell may further include additional organic material layers. The organic solar cell may reduce the number of organic material layers by using an organic material having various functions at the same time.

In one embodiment of the present specification, the first electrode is an anode, and the second electrode is a cathode. In another embodiment, the first electrode is a cathode, and the second electrode is an anode.

In another embodiment, the organic solar cell may have a structure in which an anode, a hole transfer layer, a photoactive layer, an electron transfer layer and a cathode are arranged in consecutive order, or may have a structure in which a cathode, an electron transfer layer, a photoactive layer, a hole transfer layer and an anode are arranged in consecutive order, however, the structure is not limited thereto.

In one embodiment of the present specification, the organic solar cell has a normal structure. In the normal structure, a substrate, a first electrode, a hole transfer layer, an organic material layer including a photoactive layer, an electron transfer layer and a second electrode may be laminated in this order.

In one embodiment of the present specification, the organic solar cell has an inverted structure. In the inverted structure, a substrate, a first electrode, an electron transfer layer, an organic material layer including a photoactive layer, a hole transfer layer and a second electrode may be laminated in this order.

In one embodiment of the present specification, the organic solar cell has a tandem structure. In this case, the organic solar cell may include two or more photoactive layers. The organic solar cell according to one embodiment of the present specification may have the photoactive layer in one, two or more layers.

The organic solar cell according to one embodiment of the present specification may have the photoactive layer in one, two or more layers.

In another embodiment, a buffer layer may be disposed between the photoactive layer and the hole transfer layer or between the photoactive layer and the electron transfer layer. Herein, a hole injection layer may be further disposed between the anode and the hole transfer layer. In addition, an electron injection layer may be further disposed between the cathode and the electron transfer layer.

In one embodiment of the present specification, the substrate may include a glass substrate or a transparent plastic substrate having excellent transparency, surface smoothness, handling easiness and water resistance, but is not limited thereto, and substrates commonly used in organic solar cells may be used without limit. Specific examples thereof include glass, polyethylene terphthalate (PET), polyethylene naphthalate (PEN), polypropylene (PP), polyimide (PI), triacetyl cellulose (TAC) and the like, but are not limited thereto.

A material of the first electrode may include a material that is transparent and has excellent conductivity, but is not limited thereto. Examples of the first electrode material include metals such as vanadium, chromium, copper, zinc or gold, or alloys thereof; metal oxides such as zinc oxides, indium oxides, indium tin oxides (ITO) or indium zinc oxides (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

A method of forming the first electrode is not particularly limited, however, for example, a method of sputtering, E-beam, thermal deposition, spin coating, screen printing, inkjet printing, doctor blade or gravure printing may be used.

When the first electrode is formed on a substrate, the result may go through processes of cleaning, moisture removal and modifying to be hydrophilic.

For example, after a patterned ITO substrate is cleaned with a cleaning agent, acetone and isopropyl alcohol (IPA) in consecutive order, the ITO substrate is dried for 1 minute to 30 minutes at 100° C. to 150° C., preferably for 10 minutes at 120° C., on a heating plate in order to remove moisture, and when the substrate is completely cleaned, the substrate surface is modified to be hydrophilic.

Through the surface modification such as above, the junctional surface potential may be maintained at a level suitable for the surface potential of the photoactive layer. In addition, when the surface is modified, a polymer thin film may be readily formed on the first electrode, and the quality of the thin film may be improved.

Preprocessing technologies of the first electrode include a) a surface oxidation method using parallel plate discharge, b) a method of oxidizing the surface through ozone generated by UV rays under a vacuum, and c) an oxidation method using the oxygen radicals generated by plasma.

One of the methods described above may be selected depending on the condition of the first electrode or the substrate. However, it is commonly preferred to prevent the leave of oxygen on the surface of the first electrode or the substrate and to suppress the remaining of moisture and organic materials as much as possible, no matter which method is used. In this case, practical effects of the preprocessing may be maximized.

As a specific example, a method of oxidizing the surface through ozone generated by UV rays may be used. Herein, the patterned ITO substrate may be fully dried by baking the patterned ITO substrate on a hot plate after ultrasonic cleaning, and the patterned ITO substrate is introduced into a chamber and then may be cleaned by ozone generated by reacting oxygen gas with UV light using a UV lamp.

However, the method of surface modification of the patterned ITO substrate in the present specification is not particularly limited, and any method oxidizing a substrate may be used.

The second electrode may include a metal having small work function, but is not limited thereto. Specific examples thereof may include metals such as magnesium, calcium, sodium, potassium, titanium, indium, yttrium, lithium, gadolinium, aluminum, silver, tin and lead, or alloys thereof; or multilayer structure materials such as LiF/Al, LiO$_2$/Al, LiF/Fe, Al:Li, Al:BaF$_2$ and Al:BaF$_2$:Ba, but are not limited thereto.

The second electrode may be formed by being deposited inside a thermal deposition apparatus having a degree of vacuum of 5×10$^{-7}$ torr or less, however, the formation is not limited to this method.

The hole transfer layer and/or the electron transfer layer material play a role of efficiently transferring the electrons and the holes separated in the photoactive layer to an electrode, and the material is not particularly limited.

The hole transfer layer material may include poly(3,4-ethylenedioxythiophene) doped with poly(styrenesulfonic acid) (PEDOT:PSS), molybdenum oxides (MoO$_x$); vanadium oxide (V$_2$O$_5$); nickel oxide (NiO); tungsten oxides (WO$_x$), and the like, but is not limited thereto.

The electron transfer layer material may include bathocuproine (BCP) or electron-extracting metal oxides, and may specifically include bathocuproine (BCP), a metal complex of 8-hydroxyquinoline; a complex including Alq$_3$; a metal complex including Liq; LiF; Ca; titanium oxides (TiO$_x$); zinc oxide (ZnO); cesium carbonate (Cs$_2$CO$_3$), and the like, but is not limited thereto.

In one embodiment of the present specification, a vacuum deposition method or a solution coating method may be used as a method for forming the photoactive layer, and the solution coating method means a method of dissolving a photoactive material such as an electron donor and/or an electron acceptor in an organic solvent, and then coating the solution using a method such as spin coating, dip coating, screen printing, spray coating, doctor blade and brush painting, however, the method is not limited thereto.

The compound according to one embodiment of the present specification may be prepared using preparation methods to describe below. Representative examples are described in the preparation methods to describe below, however, substituents may be added or excluded as necessary, and positions of the substituents may be changed. In addition, based on technologies known in the art, starting materials, reaction materials, reaction conditions and the like may be changed.

In addition, the present specification will be described in detail with reference to examples in order to specifically describe the present specification. However, examples according to the present specification may be modified to various other forms, and the scope of the present specification is not construed as being limited to the examples described below. Examples of the present specification are provided in order to more frilly describe the present specification to those having average knowledge in the art.

Preparation Example: Synthesis of Polymers 1 to 8

Preparation Example 1. Synthesis of Polymer 1

(1) Synthesis of Chemical Formula K

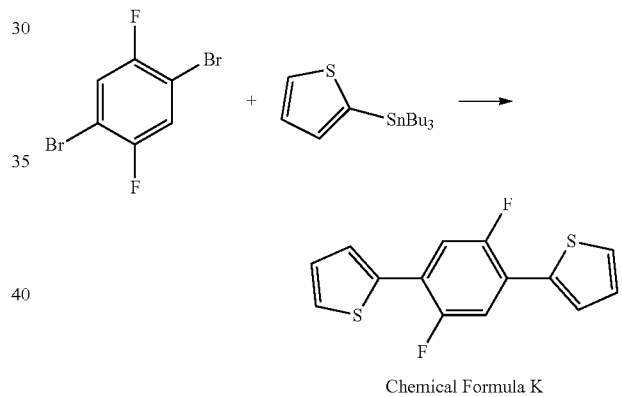

Chemical Formula K

Toluene was introduced to two starting materials, and after adding 0.05 equivalents of tetrakis(triphenylphosphine)palladium(0) (Pd(PPh$_3$)$_4$) thereto, the result was stirred for 15 hours at 80° C., and the reaction solution gradually turned black. This was worked up, dried with magnesium sulfate, and recrystallized to obtain Chemical Formula K (white powder, 4.3 g).

An NMR spectrum of the synthesized Chemical Formula K is shown in FIG. 2.

(2) Synthesis of Chemical Formula K-1

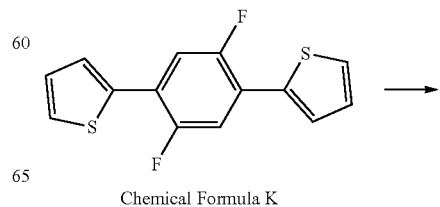

Chemical Formula K

-continued

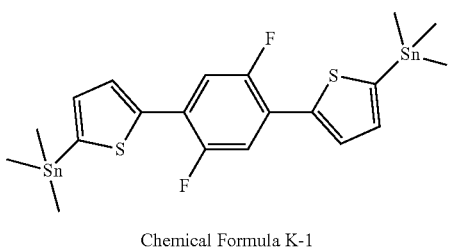

Chemical Formula K-1

The prepared Chemical Formula K was dissolved in tetrahydrofuran (THF), and after lowering the temperature to −78° C., 2.1 equivalents of n-butyllithium (n-BuLi) was added thereto, and the result was stirred for 30 minutes. After that, when the result was further stirred for 1 hour at room temperature, the solution turned yellow. The temperature was lowered again to −78° C., and after adding 2.1 equivalents of trimethyltin chloride thereto, the result was stirred for 12 hours while slowly raising the temperature to room temperature. After 12 hours, the solution turned yellow ocher, and the result was worked up and then recrystallized to obtain Chemical Formula K-1 in a glossy, plate-like yellow solid form.

Figure 3:
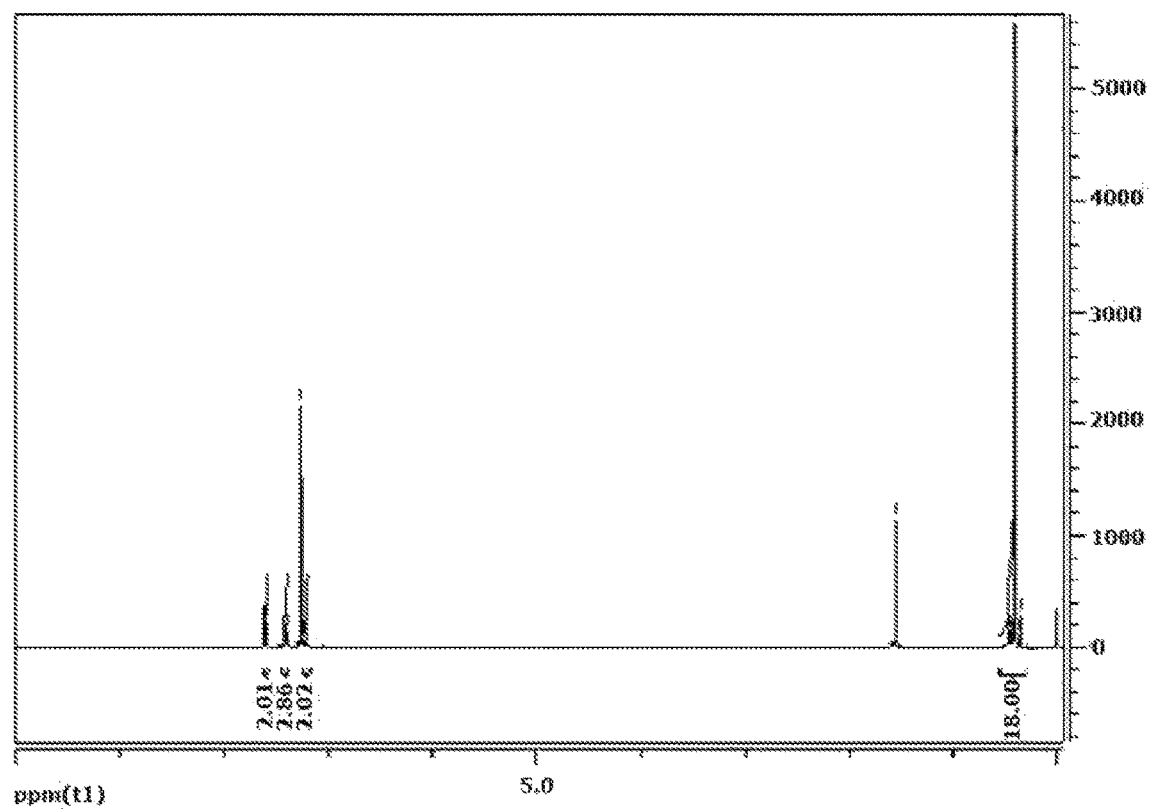
FIG. 3 is a diagram presenting an NMR spectrum of Chemical Formula K-1 synthesized in a preparation example.

An NMR spectrum of the synthesized Chemical Formula K-1 is shown in FIG. 3.

(3) Synthesis of Chemical Formula L

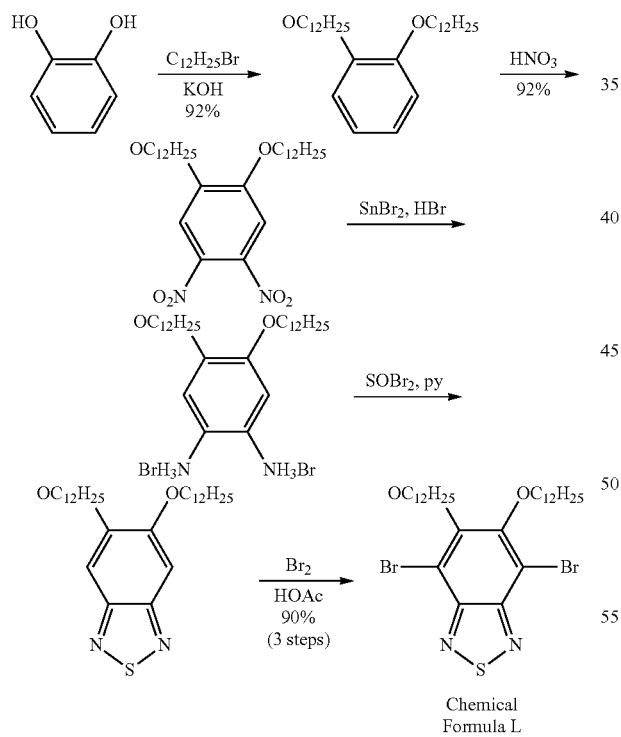

Chemical Formula L

A compound of Chemical Formula L was synthesized based on JOURNAL OF POLYMER SCIENCE PART A: POLYMER CHEMISTRY 2011, 49, 4387-4397 4389.

(4) Synthesis of Chemical Formula M

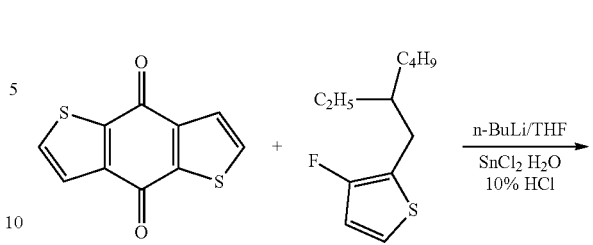

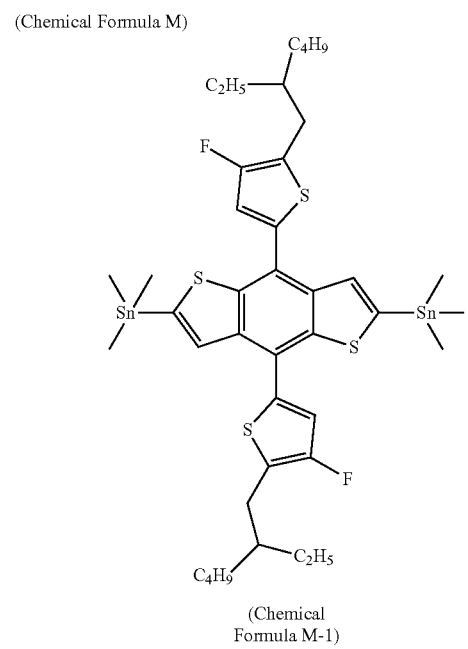

(Chemical Formula M-1)

After adding and dissolving 10.0 g of 2-(2-ethylhexyl)-3-fluorothiophene in 5500 mL of tetrahydrofuran (THF), the temperature was lowered to −78° C. At this temperature, 24.0 mL of 2.5 M n-butyllithium (n-BuLi) dissolved in hexane was slowly added thereto, and the result was stirred for 30 minutes. After that, the temperature was raised to 0° C., the result was stirred for 1 hour at this temperature, and after introducing 3.3 g of 4,8-dehydrobenzo[1,2-b:4,5-b] dithiophene-4,8-dione thereto at once, the result was stirred for 3 hours at 50° C. After cooling this solution to room temperature, tin(II)chloride dihydrate (26 g) and 1 M HCl (56 ml) were introduced thereto, and the result was further stirred for 3 hours. Ice was poured into this solution, the result was extracted twice with diethyl ether, washed twice with water, and residual water was removed using magnesium sulfate ($MgSO_4$). The remaining solution was vacuumed to remove the solvent, and through silica column, Chemical Formula M was obtained in a yellow dense liquid form. (Yield: 40%)

(5) Synthesis of Chemical Formula M-1

After adding and dissolving 3 g of a compound of Chemical Formula M in 100 mL of tetrahydrofuran (THF), the temperature was lowered to 0° C. At this temperature, 2.1 equivalents of 1.6 M n-butyllithium (n-BuLi) dissolved in hexane was slowly added thereto, and the result was stirred for 1 hour at room temperature. To this solution, 3 equivalents of 1 M timethyltin chloride dissolved in THF was introduced at once, and the result was stirred for 2 hours. Water was poured into this solution, the result was extracted twice with diethyl ether, washed twice with water, and residual water was removed using magnesium sulfate ($MgSO_4$). The remaining solution was vacuumed to remove the solvent, and recrystallized with ethanol to obtain Chemical Formula M-1 in a light yellow crystalline form. (Yield: 60%)

(6) Synthesis of Polymer 1

The monomers of Chemical Formulae K-1, L and M-1 synthesized above were introduced together with $Pd_2(dba)_3$ and $P(o\text{-tolyl})_3$ using chlorobenzene as a solvent, and polymerized using a microwave reactor to prepare the following Polymer 1. When analyzing the prepared Polymer 1 through gel permeation chromatography (GPC), the number average molecular weight (Mn) was 59,800 g/mol, the weight average molecular weight (Mw) was 70,330 g/mol, the HOMO and the LUMO energy levels were 5.3 and 3.45, respectively, and the UV edge was 670 nm.

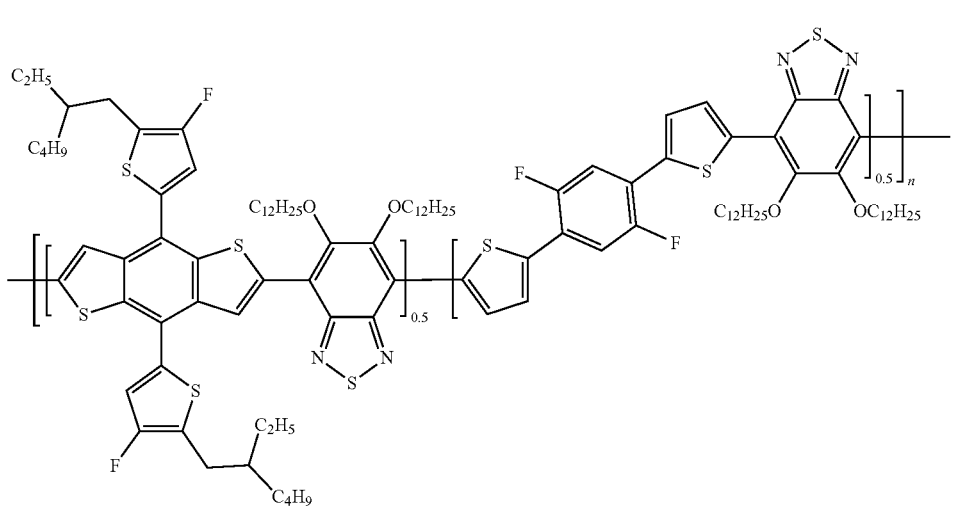

[Polymer 1]

Preparation Example 2. Synthesis of Polymer 2

Polymer 2 was prepared in the same manner as in Preparation Example 1 except that the following compounds were used as the reactants in (4) of Preparation Example 1. When analyzing the prepared Polymer 2 through GPC, the number average molecular weight (Mn) was 49,200 g/mol, the weight average molecular weight (Mw) was 65,980 g/mol, the HOMO and the LUMO energy levels were 5.31 and 3.46, respectively, and the UV edge was 671 nm.

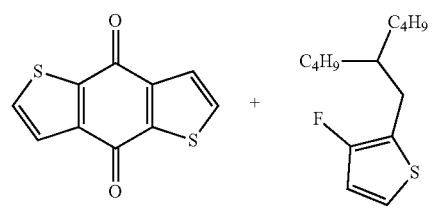

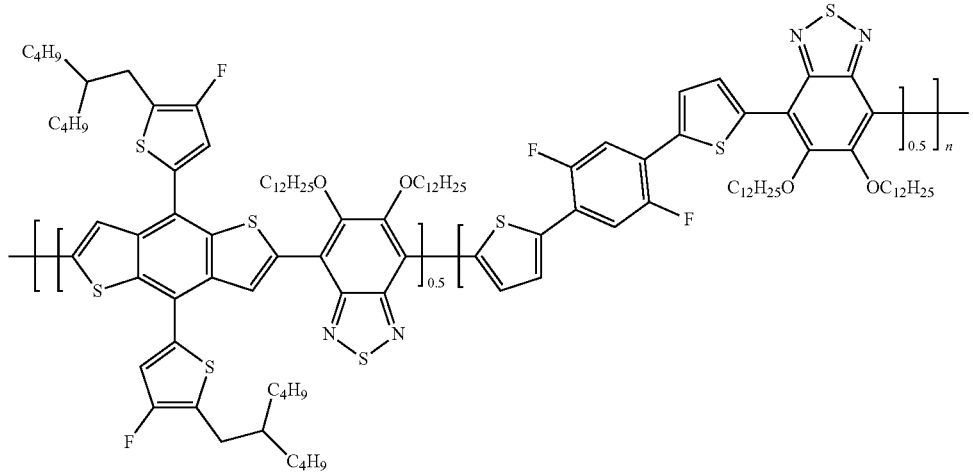
[Polymer 2]

Preparation Example 3. Synthesis of Polymer 3

Polymer 3 was prepared in the same manner as in Preparation Example 2 except that $C_8H_{17}Br$ was used instead of $C_{12}H_{25}Br$ in (3) of Preparation Example 2. When analyzing the prepared Polymer 3 through GPC, the number average molecular weight (Mn) was 54,670 g/mol, the weight average molecular weight (Mw) was 68,990 g/mol, the HOMO and the LUMO energy levels were 5.31 and 3.46, respectively, and the UV edge was 670 nm.

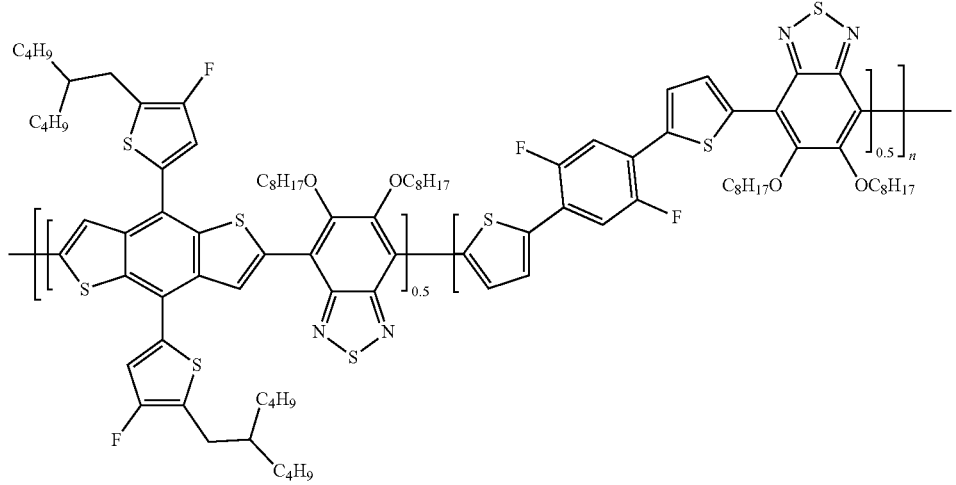
[Polymer 3]

Preparation Example 4. Synthesis of Polymer 4

Polymer 4 was prepared in the same manner as in Preparation Example 1 except that

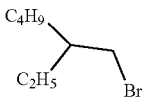

was used instead of $C_{12}H_{25}Br$ in (3) of Preparation Example 1, and the following compounds were used as the reactants in (4) of Preparation Example 1. When analyzing the prepared Polymer 4 through GPC, the number average molecular weight (Mn) was 59,800 g/mol, the weight average molecular weight (Mw) was 70,330 g/mol, the HOMO and the LUMO energy levels were 5.3 and 3.45, respectively, and the UV edge was 670 nm.

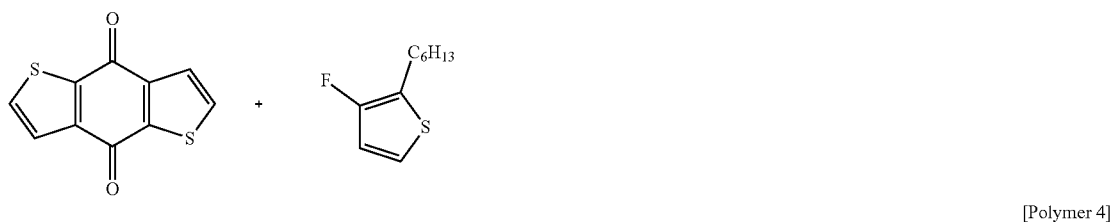

[Polymer 4]

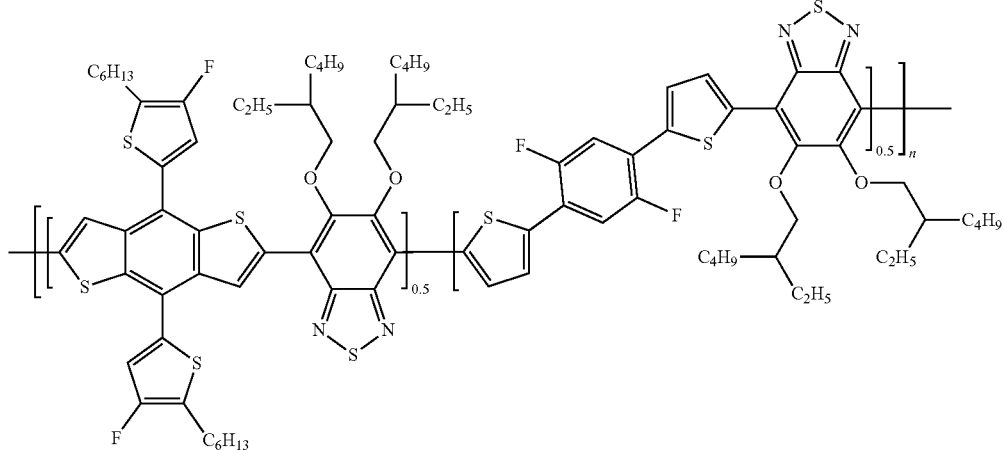

Preparation Example 5. Synthesis of Polymer 5

Polymer 5 was prepared in the same manner as in Preparation Example 1 except that

was used instead of $C_{12}H_{25}Br$ in (3) of Preparation Example 1. When analyzing the prepared Polymer 5 through GPC, the number average molecular weight (Mn) was 46,240 g/mol, the weight average molecular weight (Mw) was 62,380 g/mol, the HOMO and the LUMO energy levels were 5.32 and 3.46, respectively, and the UV edge was 667 nm.

Preparation Example 6. Synthesis of Polymer 6

(1) Synthesis of Chemical Formula N octylbromide $\xrightarrow{\text{Mg, THF}}$

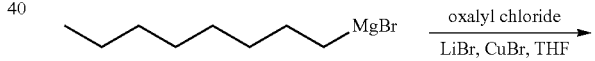

[Polymer 5]

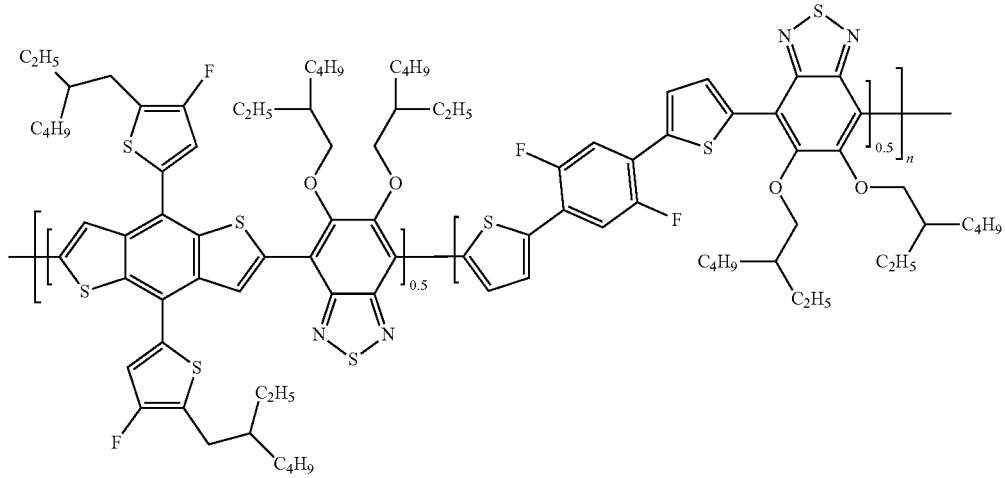

64

Preparation Example 7. Synthesis of Polymer 7

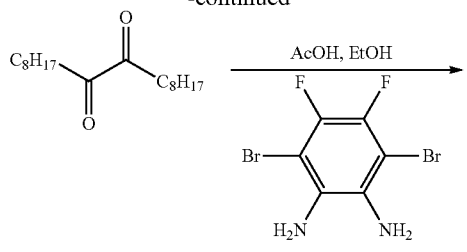
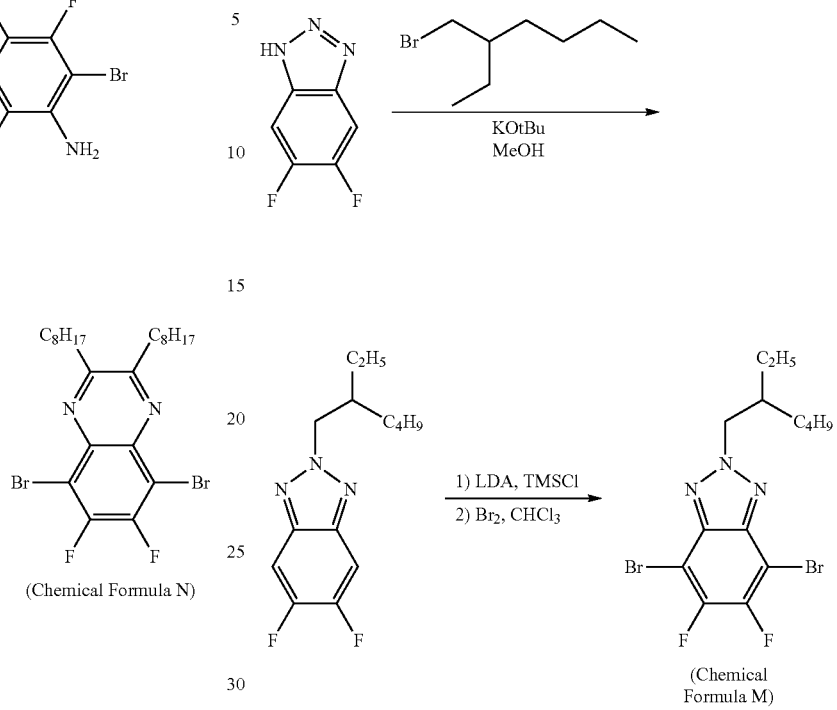

A compound of Chemical Formula N was synthesized based on Polymer Bulletin, 2017, Vol. 74, No. 7, pp 2755-2766.

Polymer 6 was prepared in the same manner as in Preparation Example 1 except that Chemical Formula N was used instead of Chemical Formula L. When analyzing the prepared Polymer 6 through GPC, the number average molecular weight (Mn) was 38,290 g/mol, the weight average molecular weight (Mw) was 55,240 g/mol, the HOMO and the LUMO energy levels were 5.3 and 3.45, respectively, and the UV edge was 670 nm.

A compound of Chemical Formula M was synthesized based on J. Am. Chem. Soc. 2011, 133, pp 4625-4631.

Polymer 7 was prepared in the same manner as in Preparation Example 1 except that Chemical Formula M was used instead of Chemical Formula L. When analyzing the prepared Polymer 7 through GPC, the number average molecular weight (Mn) was 35,960 g/mol, the weight average molecular weight (Mw) was 44,510 g/mol, the HOMO and the LUMO energy levels were 5.29 and 3.42, respectively, and the UV edge was 663 nm.

[Polymer 6]

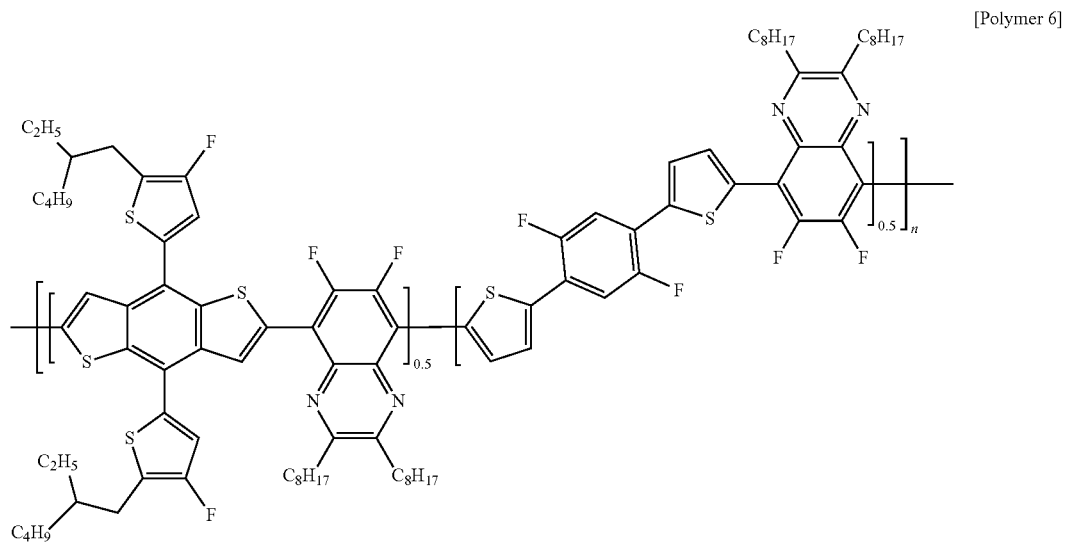

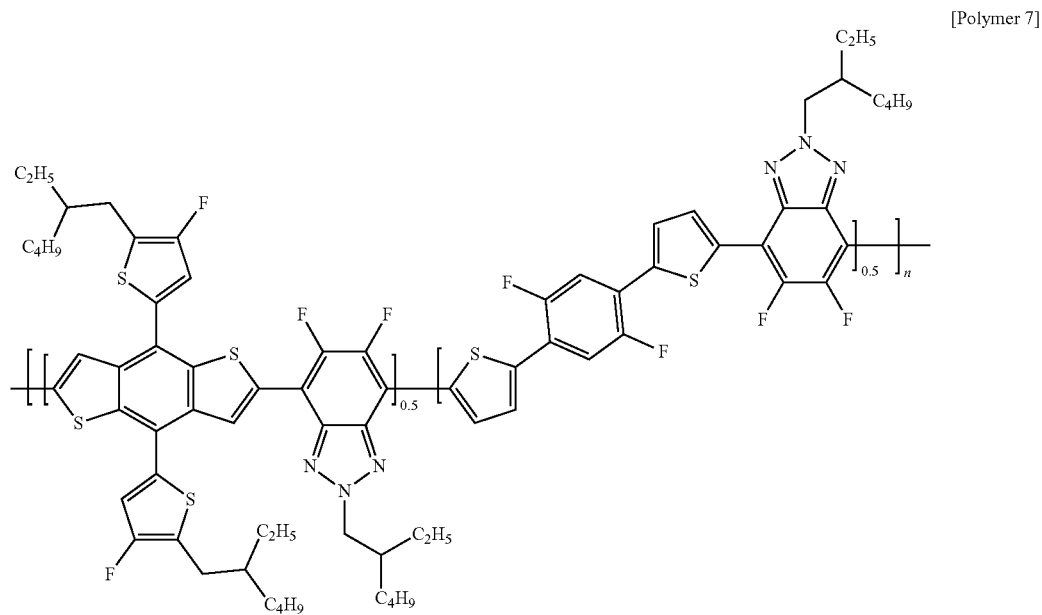

[Polymer 7]

Preparation Example 8. Synthesis of Polymer 8

The following Polymer 8 was prepared using

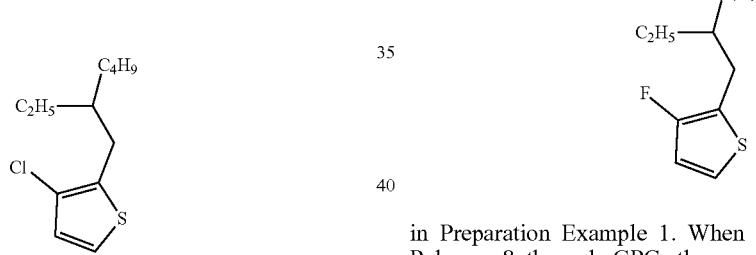

instead of in Preparation Example 1. When analyzing the prepared Polymer 8 through GPC, the number average molecular weight (Mn) was 28,850 g/mol, the weight average molecular weight (Mw) was 51,350 g/mol, the PDI was 1.78, the HOMO and the LUMO energy levels were 5.31 and 3.46, respectively, and the UV edge was 672 nm.

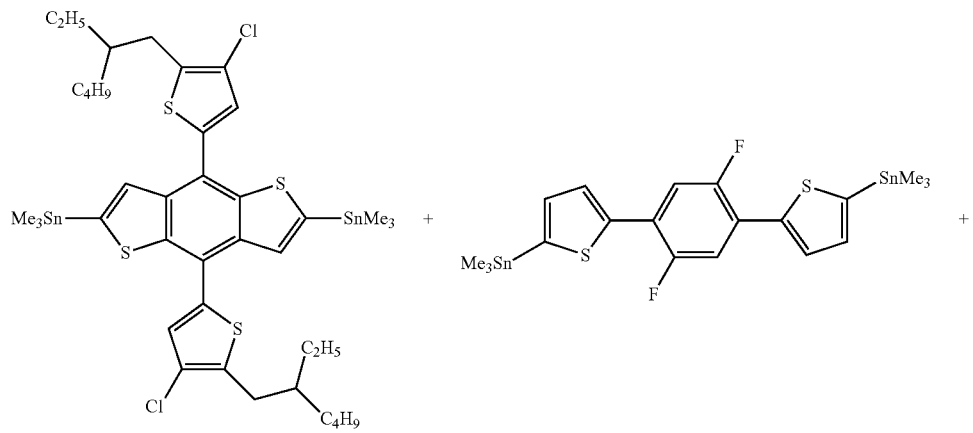

-continued

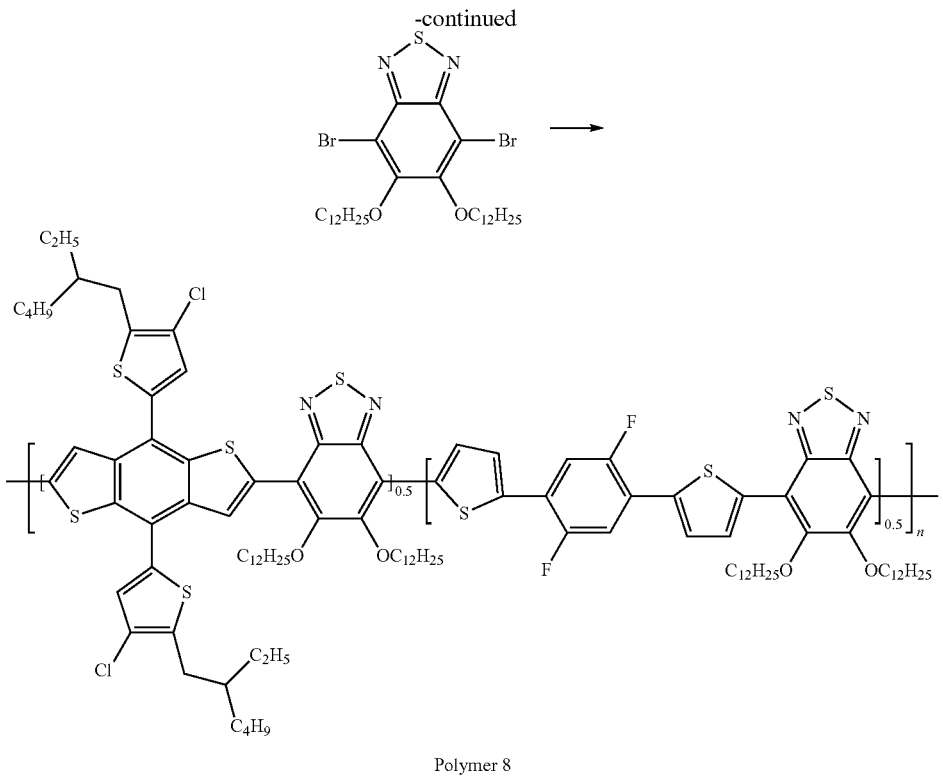

Polymer 8

Example: Manufacture of Organic Solar Cell

Example 1

(1) Preparation of Composite Solution

Polymer 1 and Chemical Formula A-1 (Solarmer Materials Inc.) were dissolved in chlorobenzene (CB, 2 mL) in a mass ratio of 1:2 to prepare a composite solution with a 2.0 wt % concentration.

(2) Manufacture of Organic Solar Cell

ITO was formed on a substrate as a first electrode, the ITO substrate was ultrasonic cleaned using distilled water, acetone and 2-propanol, and the ITO surface was ozone treated for 10 minutes.

On the ITO, ZnO was spin-coated to form an electron transfer layer (thickness 40 nm). Then the composite solution of Polymer 1 and Chemical Formula A-1 was spin-coated on the electron transfer layer to form a photoactive layer (thickness 100 nm), and a hole transfer layer was formed on the photoactive layer by depositing $MoO_3$ to a thickness of 10 nm. Lastly, for forming a second electrode, Ag was deposited to a thickness of 100 nm using a thermal evaporator under a vacuum of $3\times10^{-8}$ torr, and an organic solar cell was manufactured.

[Chemical Formula A-1]

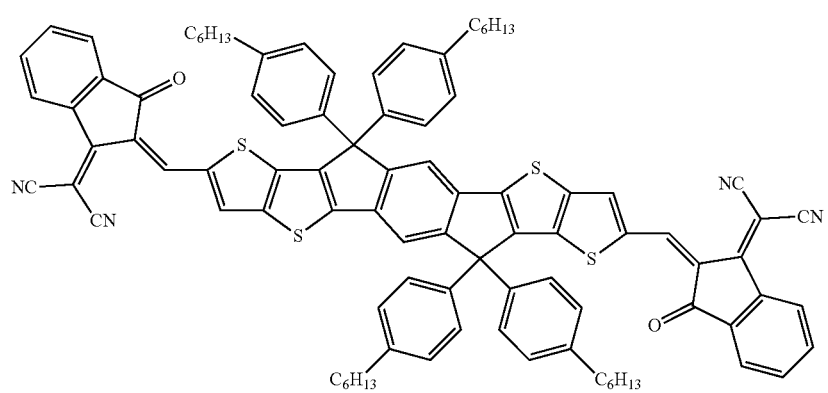

Example 2

An organic solar cell was manufactured in the same manner as in Example 1 except that Polymer 2 was used instead of Polymer 1.

Example 3

An organic solar cell was manufactured in the same manner as in Example 1 except that Polymer 3 was used instead of Polymer 1.

Example 4

An organic solar cell was manufactured in the same manner as in Example 1 except that Polymer 4 was used instead of Polymer 1.

Example 5

An organic solar cell was manufactured in the same manner as in Example 1 except that Polymer 5 was used instead of Polymer 1.

Example 6

An organic solar cell was manufactured in the same manner as in Example 1 except that Polymer 6 was used instead of Polymer 1.

Example 7

An organic solar cell was manufactured in the same manner as in Example 1 except that Polymer 7 was used instead of Polymer 1.

Example 8

An organic solar cell was manufactured in the same manner as in Example 1 except that the following Chemical Formula A-6 (Solarmer Materials Inc.) was used instead of Chemical Formula A-1.

[Chemical Formula A-6]

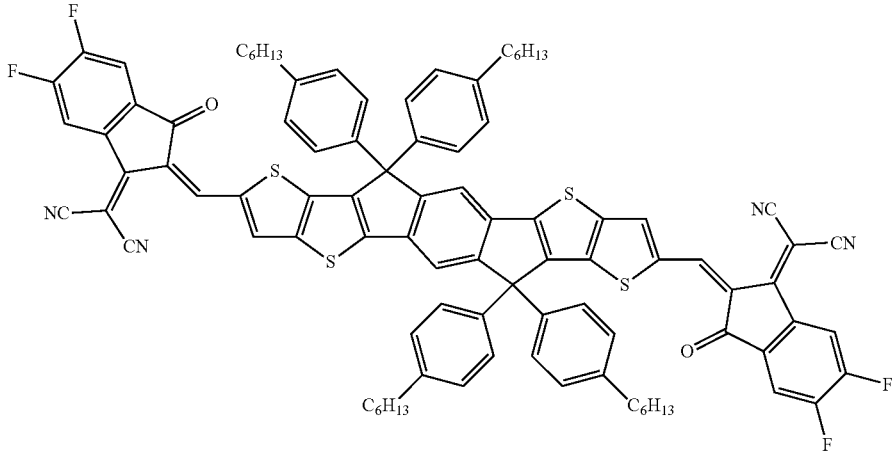

Example 9

An organic solar cell was manufactured in the same manner as in Example 1 except that Polymer 8 was used instead of Polymer 1.

Comparative Example 1

An organic solar cell was manufactured in the same manner as in Example 1 except that the following Comparative Polymer 1 was used instead of Polymer 1.

[Comparative Polymer 1]

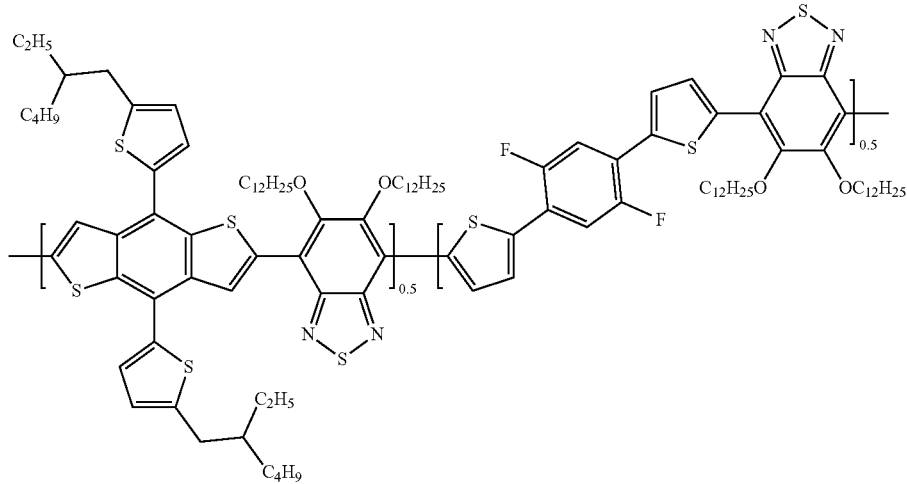

Comparative Example 2

An organic solar cell was manufactured in the same manner as in Example 8 except that the following Comparative Polymer 1 was used instead of Polymer 1 in Example 8.

Comparative Example 3

An organic solar cell was manufactured in the same manner as in Example 1 except that $PC_{71}BM$ was used instead of Chemical Formula A-1.

Photoelectric conversion properties of the organic solar cells manufactured in the examples and the comparative examples were measured under a condition of 100 mW/cm² (AM 1.5), and the results are shown in the following Table 1.

TABLE 1

|  | Composite Solution | $V_{oc}$ (V) | $J_{sc}$ (mA/cm²) | FF | η (%) |
|---|---|---|---|---|---|
| Example 1 | Polymer 1 + Chemical Formula A-1 | 1.017 | 13.287 | 0.617 | 8.34 |
| Example 2 | Polymer 2 + Chemical Formula A-1 | 0.881 | 13.495 | 0.686 | 8.16 |
| Example 3 | Polymer 3 + Chemical Formula A-1 | 0.897 | 13.443 | 0.699 | 8.43 |
| Example 4 | Polymer 4 + Chemical Formula A-1 | 0.869 | 14.697 | 0.612 | 7.82 |
| Example 5 | Polymer 5 + Chemical Formula A-1 | 0.867 | 14.560 | 0.630 | 7.95 |
| Example 6 | Polymer 6 + Chemical Formula A-1 | 0.908 | 13.121 | 0.649 | 7.73 |
| Example 7 | Polymer 7 + Chemical Formula A-1 | 0.918 | 12.494 | 0.665 | 7.63 |
| Example 8 | Polymer 1 + Chemical Formula A-6 | 0.881 | 13.780 | 0.707 | 8.58 |
| Example 9 | Polymer 8 + Chemical Formula A-6 | 0.907 | 13.707 | 0.670 | 8.33 |
| Comparative Example 1 | Comparative Polymer 1 + Chemical Formula A-1 | 0.925 | 13.133 | 0.615 | 7.47 |
| Comparative Example 2 | Comparative Polymer 1 + Chemical Formula A-6 | 0.748 | 15.713 | 0.632 | 7.43 |
| Comparative Example 3 | Polymer 1 + $PC_{71}BM$ | 0.864 | 9.823 | 0.585 | 4.96 |

In Table 1, the $V_{OC}$ means an open-circuit voltage, the $J_{sc}$ means a short-circuit current, the FF means a fill factor, and the η means energy conversion efficiency. The open-circuit voltage and the short-circuit current are respectively an x-axis and a y-axis intercept in the four quadrants of a voltage-current density curve, and as these two values increase, solar cell efficiency is preferably enhanced. In addition, the fill factor is a value dividing the rectangle area that may be drawn inside the curve by the product of the short-circuit current and the open-circuit voltage. The energy conversion efficiency (η) may be obtained when the product of the open-circuit voltage ($V_{oc}$), the short-circuit current ($J_{sc}$) and the fill factor (FF) is divided by the intensity of incident light ($P_{in}$), and it is preferred as the value is higher.

$$\eta = \frac{V_{oc} J_{sc} FF}{P_{in}}$$

In Table 1, when comparing Examples 1 to 7 and Comparative Example 1 using Chemical Formula A-1 as an electron acceptor material in the same manner, it was identified that Examples 1 to 7 had a higher open-circuit voltage, and superior energy conversion efficiency as well.

In addition, when comparing Examples 8 and 9 and Comparative Example 2 using Chemical Formula A-6 as an electron acceptor material in the same manner, it was identified that Examples 8 and 9 had a higher open-circuit voltage, and superior energy conversion efficiency as well.

In other words, when using the polymer according to one embodiment of the present specification as an electron donor material, it was proved that efficiency with a non-fullerene-based electron acceptor was superior compared to existing other electron donor materials.

In addition, by comparing the results of Example 1 and Comparative Example 3, it was seen that performance of the polymer according to one embodiment of the present specification was far superior when using a non-fullerene-based compound as an electron acceptor compared to when using a fullerene-based compound such as $PC_{71}BM$ as an electron acceptor.

What is claimed is:

1. A polymer comprising:
   a first unit of Chemical Formula 1;
   a second unit of Chemical Formula 2; and
   a third unit of Chemical Formulae 3-6 or 3-7:

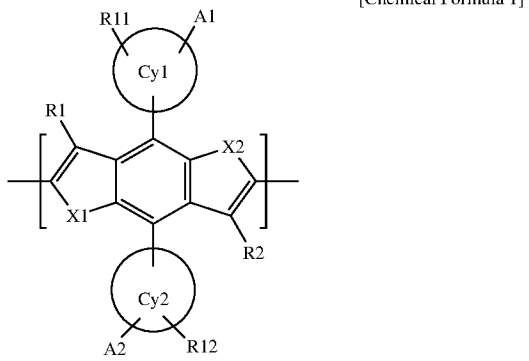

[Chemical Formula 1]

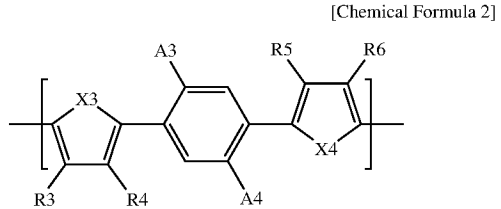

[Chemical Formula 2]

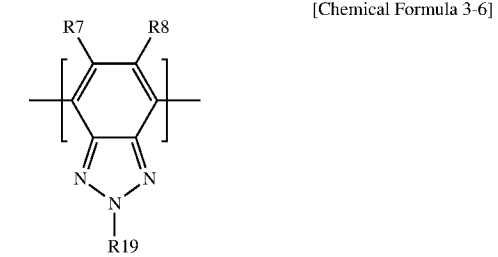

[Chemical Formula 3-6]

-continued

[Chemical Formula 3-7]

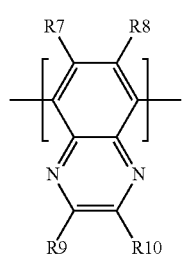

wherein:
X1 to X4 are the same as or different from each other, and each independently is CRR', NR, O, SiRR', PR, S, GeRR', Se or Te;
A1 to A4 are the same as or different from each other, and each independently is a halogen group;
Cy1 and Cy2 are the same as or different from each other, and each independently is a substituted or unsubstituted heterocyclic group;
R, R', and R1 to R8 are the same as or different from each other, and each independently is hydrogen, deuterium, a halogen group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthio group, a substituted or unsubstituted arylthio group, a substituted or unsubstituted alkylsulfoxy group, a substituted or unsubstituted arylsulfoxy group, a substituted or unsubstituted alkenyl group, a substituted or unsubstituted amine group, a substituted or unsubstituted aryl group, or a substituted or unsubstituted heterocyclic group; and
R11 and R12 are the same as or different from each other, and each independently is a substituted or unsubstituted alkyl group, a substituted or unsubstituted alkoxy group, or a substituted or unsubstituted alkylthio group and
R9 and R10 are the same as or different from each other, and each independently is hydrogen, a substituted or unsubstituted alkyl group, a substituted or unsubstituted alkoxy group, a substituted or unsubstituted alkylthio group, a substituted or unsubstituted aryloxy group, a substituted or unsubstituted arylthio group, a substituted or unsubstituted aryl group, or a substituted or unsubstituted heterocyclic group.

2. The polymer of claim 1, wherein the first unit is Chemical Formula 1-1:

[Chemical Formula 1-1]

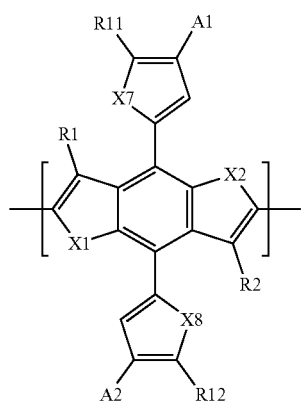

wherein:
R, R', R1, R2, R11, R12, X1, X2, A1 and A2 have the same definitions as in Chemical Formula 1; and
X7 and X8 are the same as or different from each other, and each independently is NR, O, SiRR', PR, S, GeRR', Se or Te.

3. The polymer of claim 1, wherein the first unit is Chemical Formula 1-2:

[Chemical Formula 1-2]

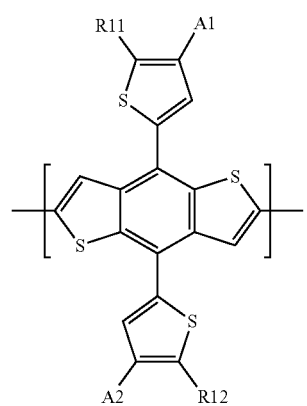

wherein:
R11, R12, A1 and A2 have the same definitions as in Chemical Formula 1.

4. The polymer of claim 1, wherein the second unit is Chemical Formula 2-1:

[Chemical Formula 2-1]

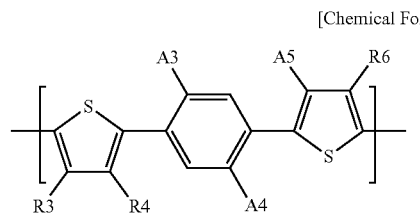

wherein:
R3 to R6, A3 and A4 have the same definitions as in Chemical Formula 2.

5. The polymer of claim 1, comprising a unit of Chemical Formula 5:

[Chemical Formula 5]

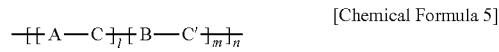

wherein:
l is a mole fraction and is a real number of $0<l<1$;
m is a mole fraction and is a real number of $0<m<1$;
$l+m=1$;
A is the first unit of Chemical Formula 1;
B is the second unit of Chemical Formula 2;
C and C' are the same as or different from each other, and each independently is the third unit of Chemical Formulae 3-6 or 3 to 7; and
n is a repetition number of the unit and is an integer of 1 to 10,000.

6. A polymer of Chemical Formulae 5-5, 5-7, 5-8, or 5-9:
[Chemical Formula 5-5]
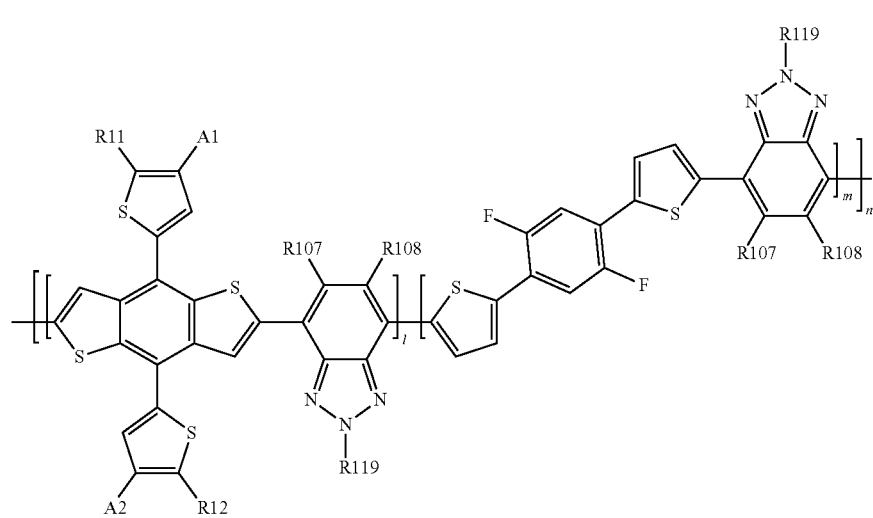
[Chemical Formula 5-7]
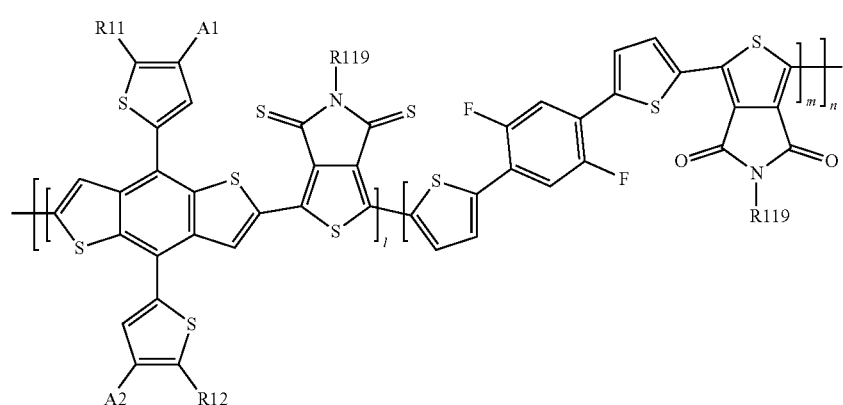
[Chemical Formula 5-8]
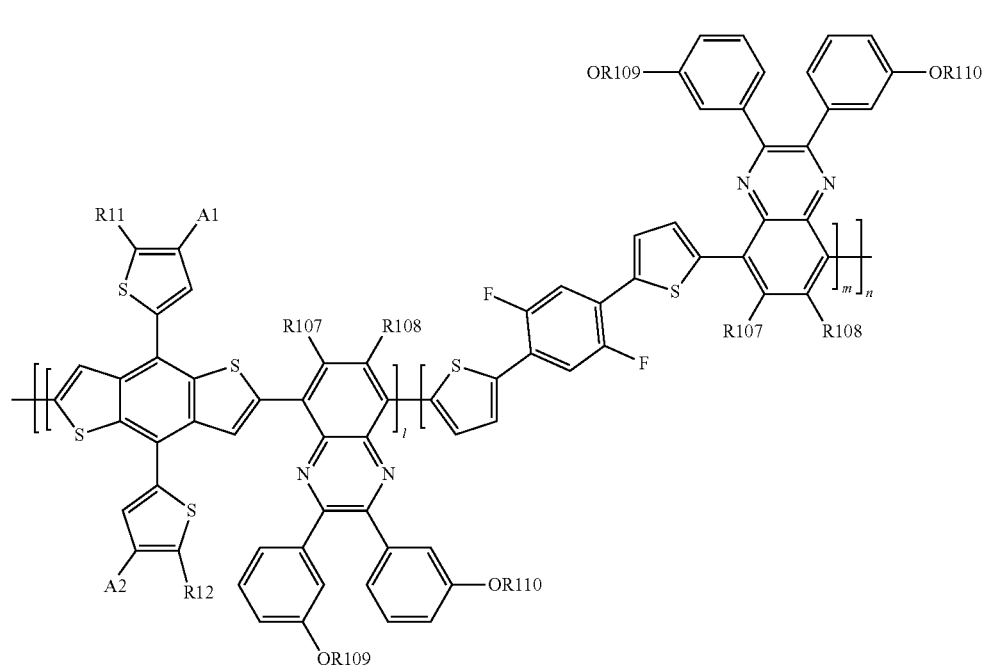

-continued

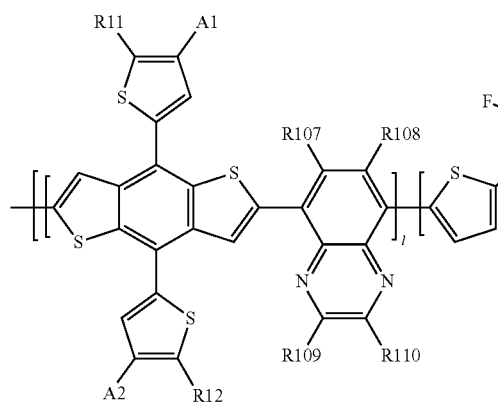

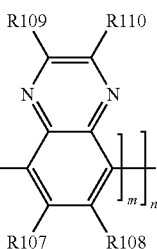

[Chemical Formula 5-9]

wherein:
A1, A2, R11 and R12 have the same definitions as in Chemical Formula 1;
R107 and R108 are the same as or different from each other and each independently is hydrogen, a substituted or unsubstituted alkyl group, a substituted or unsubstituted alkoxy group or a halogen group;
R109, R110 and R119 are the same as or different from each other and each independently is hydrogen or a substituted or unsubstituted alkyl group;

l is a mole fraction and is a real number of 0<l<1;
m is a mole fraction and is a real number of 0<m<1;
l+m=1; and
n is a repetition number of the unit and is an integer of 1 to 10,000.

7. A polymer of Chemical Formulae 6-5, 6-6, 6-8, 6-9, 6-10, 6-11, 6-12, 6-20, 6-21, 6-23, 6-24, 6-25, 6-26, or 6-27:

[Chemical Formula 6-5]

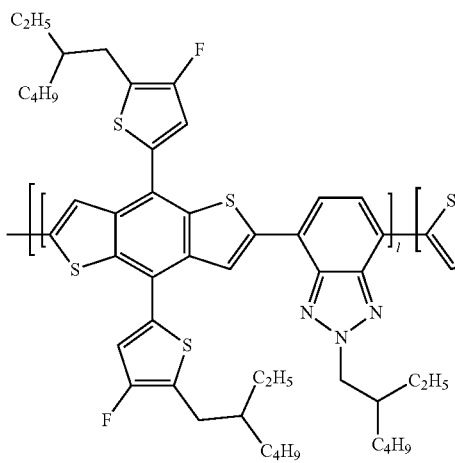

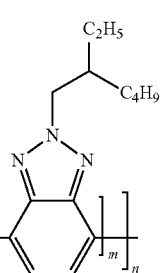

[Chemical Formula 6-6]
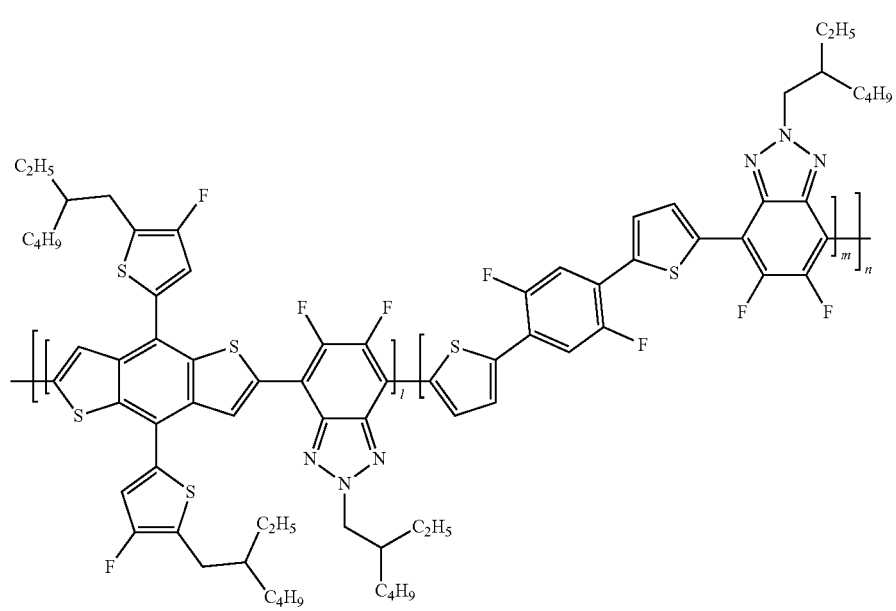
[Chemical Formula 6-8]
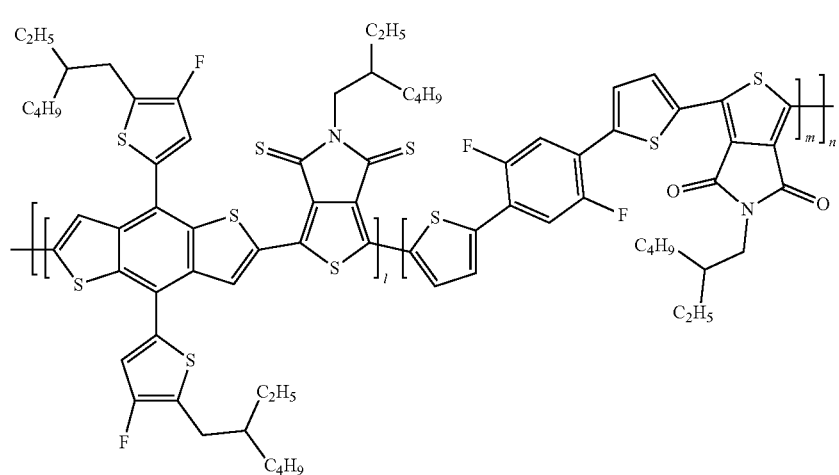

-continued
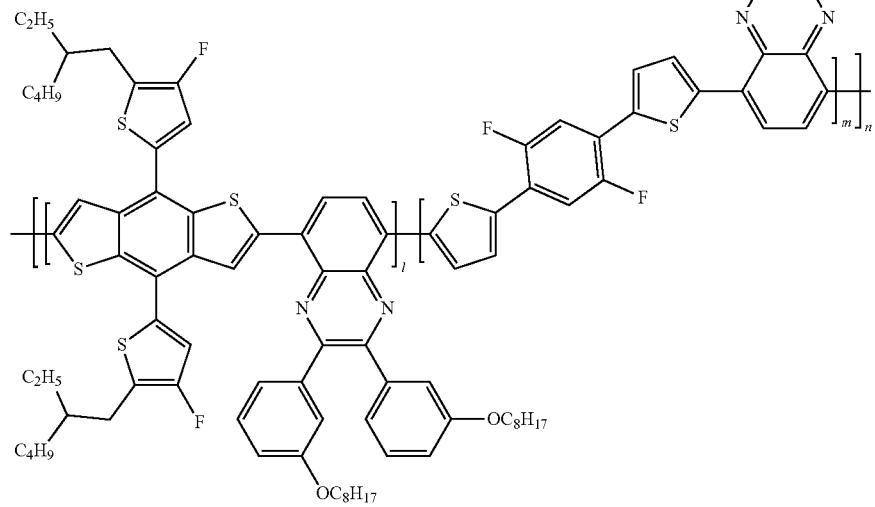
[Chemical Formula 6-9]
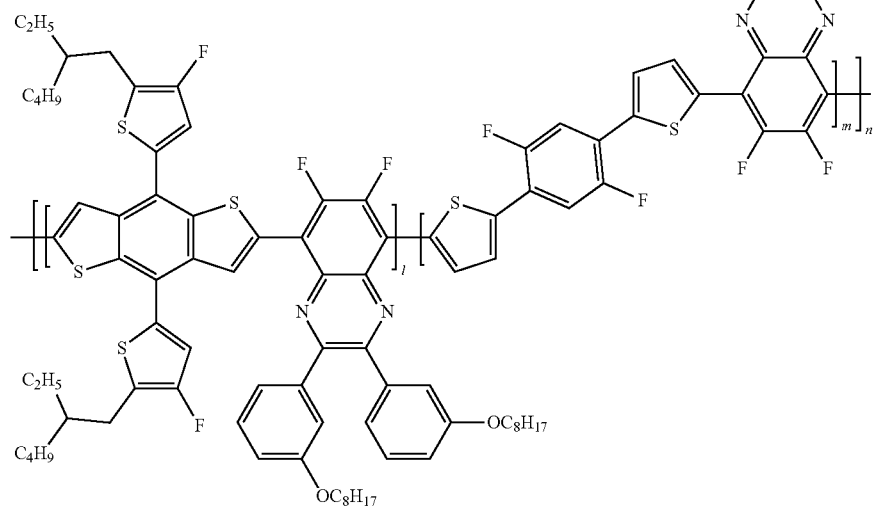
[Chemical Formula 6-10]

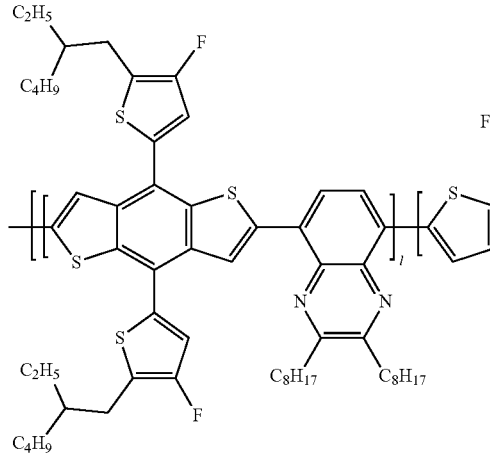
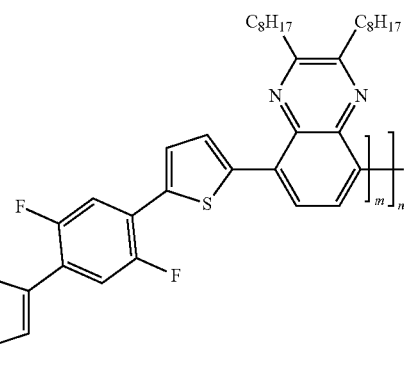
[Chemical Formula 6-11]
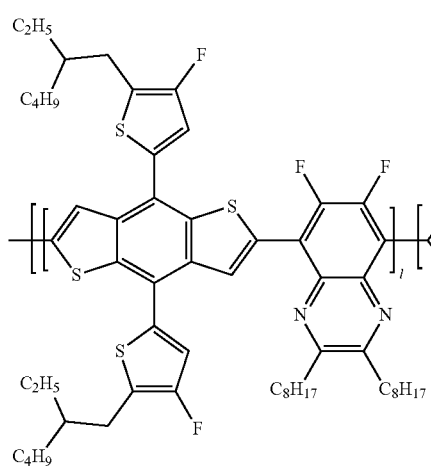
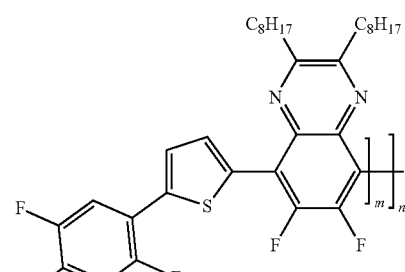
[Chemical Formula 6-12]
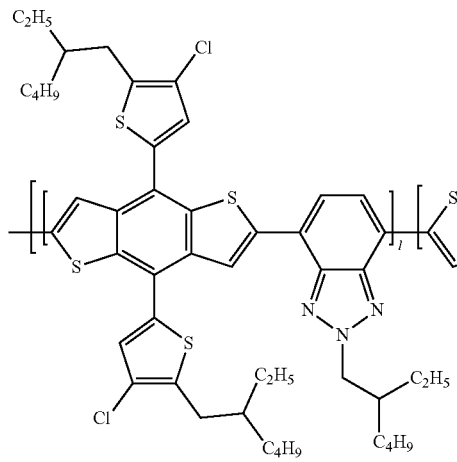
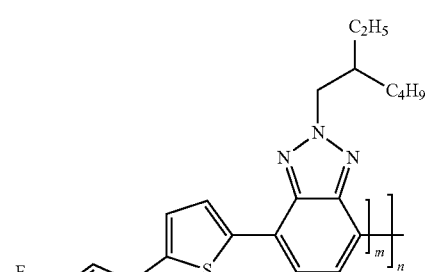
[Chemical Formula 6-20]

[Chemical Formula 6-21]
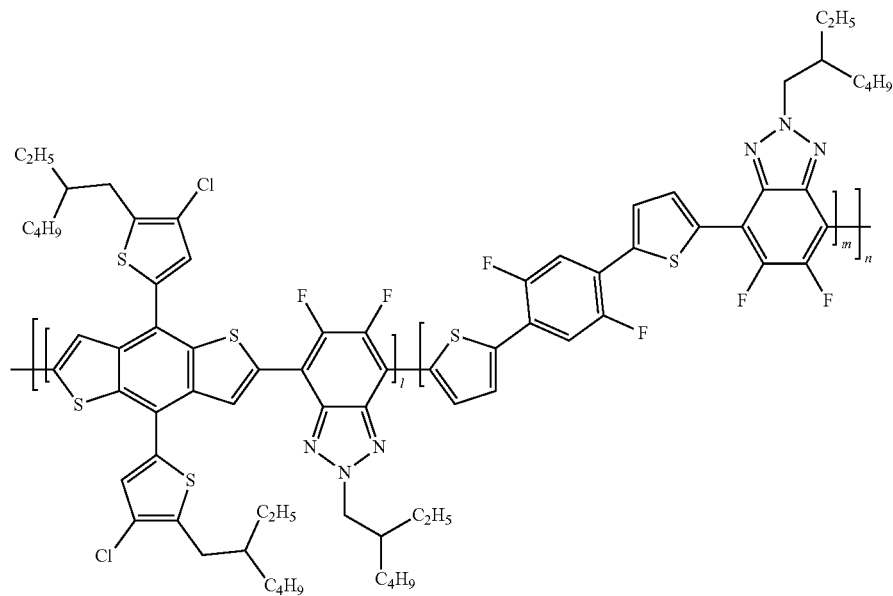
[Chemical Formula 6-23]
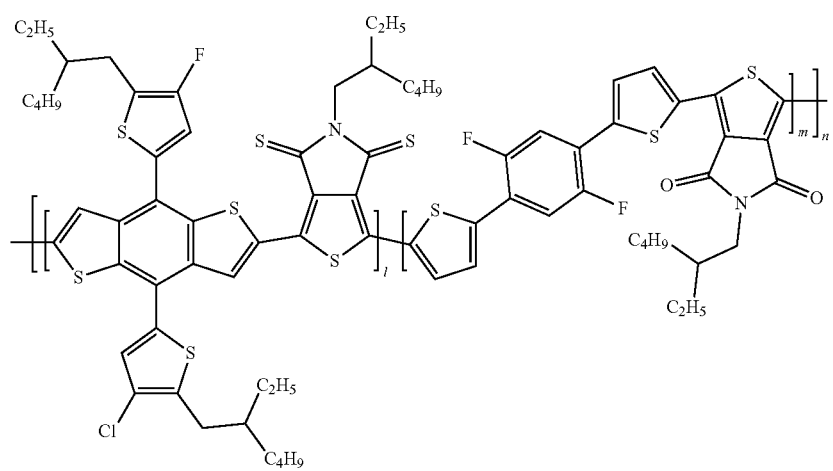

[Chemical Formula 6-24]
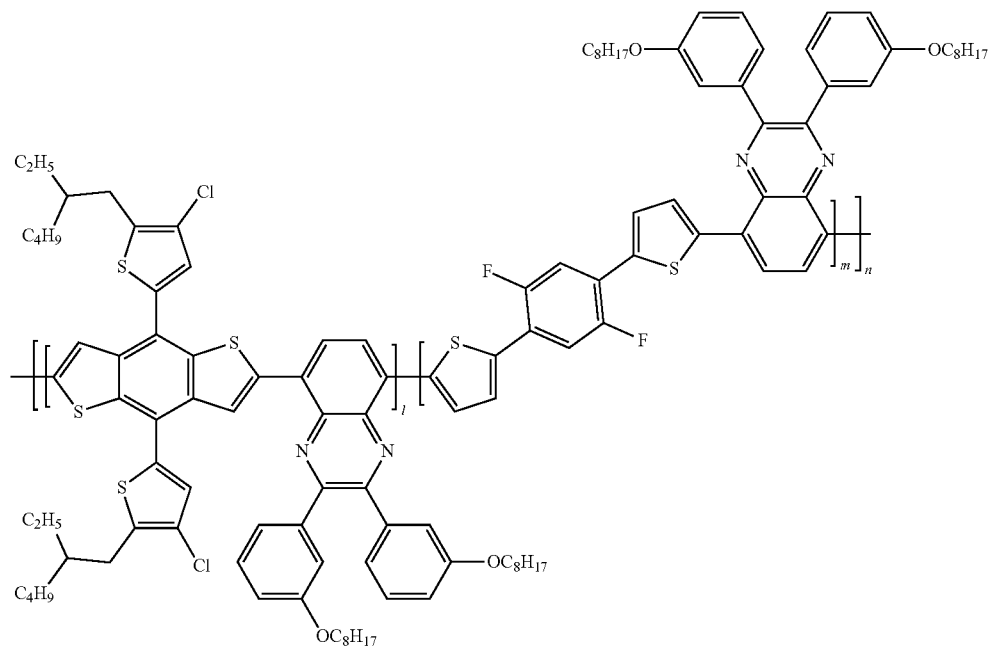
[Chemical Formula 6-25]
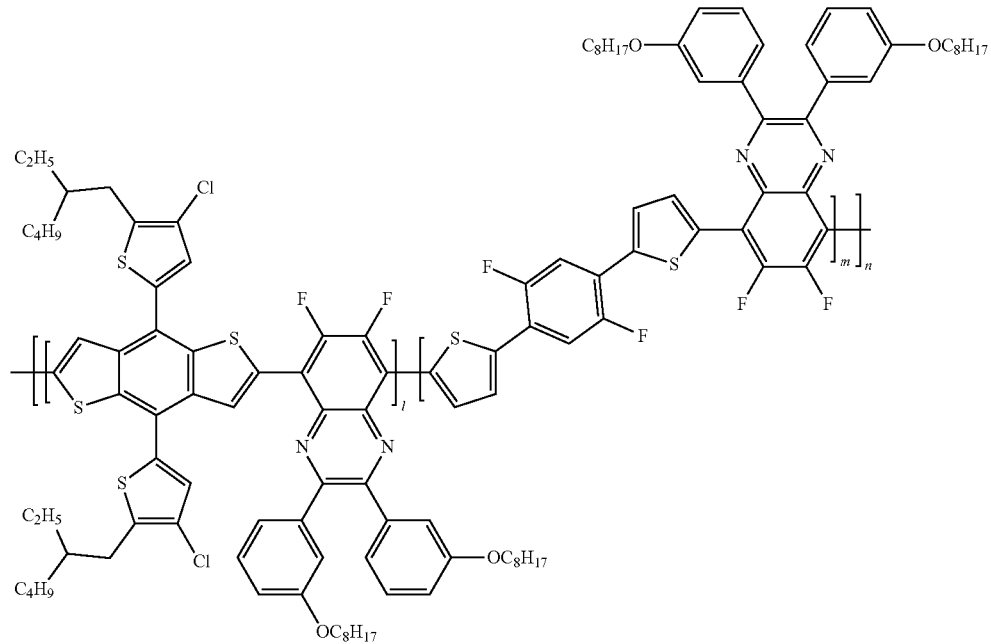

-continued

[Chemical Formula 6-26]

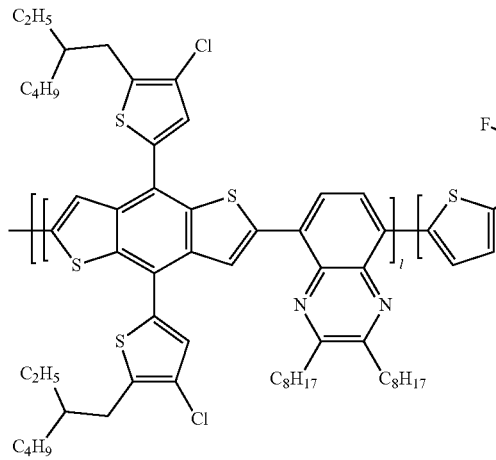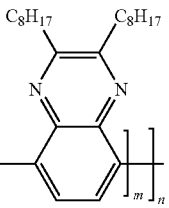

[Chemical Formula 6-27]

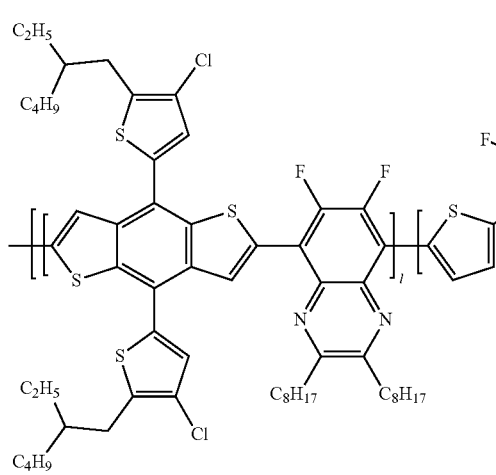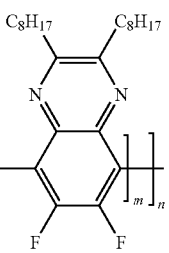

wherein:
l is a mole fraction and is a real number of 0<l<1;
m is a mole fraction and is a real number of 0<m<1;
l+m=1; and
n is a repetition number of the unit and is an integer of 1 to 10,000.

8. An organic solar cell comprising:
a first electrode;
a second electrode on the first electrode; and
one or more organic material layers that are between the first electrode and the second electrode, and the one or more organic material layers including a photoactive layer,
wherein the photoactive layer includes the polymer of claim 1.

9. The organic solar cell of claim 8, wherein the photoactive layer includes an electron donor and an electron acceptor, and the electron donor includes the polymer.

10. The organic solar cell of claim 9, wherein the electron acceptor includes a non-fullerene-based compound.

11. The organic solar cell of claim 10, wherein the non-fullerene-based compound is a compound of Chemical Formula A:

[Chemical Formula A]

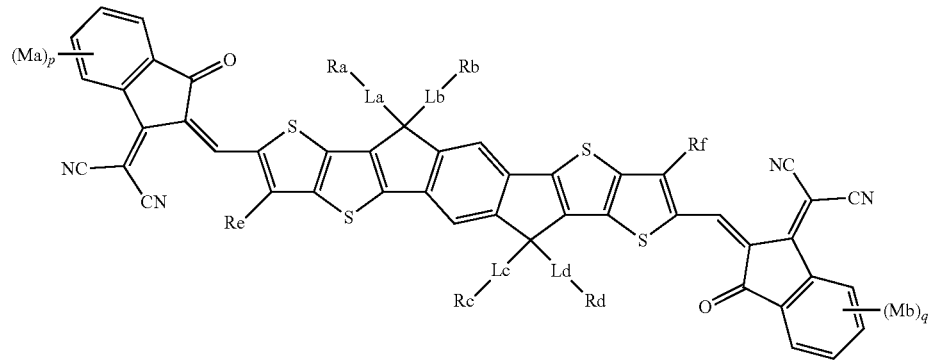

wherein:

Ra to Rf are the same as or different from each other, and each independently is hydrogen or a substituted or unsubstituted alkyl group;

La to Ld are the same as or different from each other, and each independently is a substituted or unsubstituted arylene group or a substituted or unsubstituted divalent heterocyclic group;

Ma and Mb are the same as or different from each other, and each independently is a halogen group or a substituted or unsubstituted alkyl group;

p and q are the same as or different from each other, and each independently is an integer of 0 to 2; and when p or q is 2, structures in the parentheses are the same as each other.

12. The organic solar cell of claim 9, wherein the electron acceptor is any one of Chemical Formulae A-1 to A-6:

[Chemical Formula A-1]

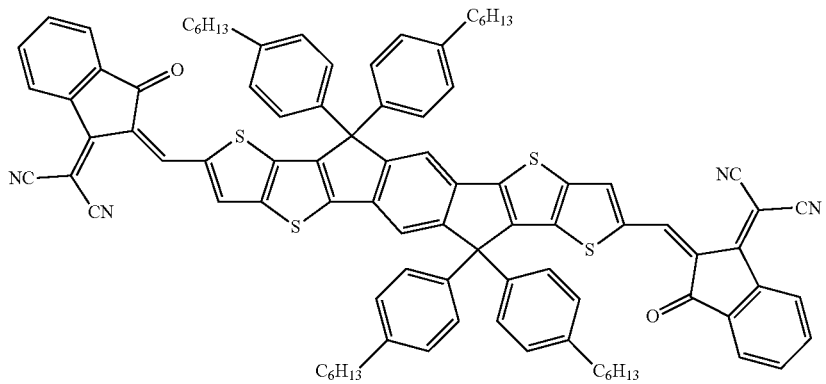

[Chemical Formula A-2]

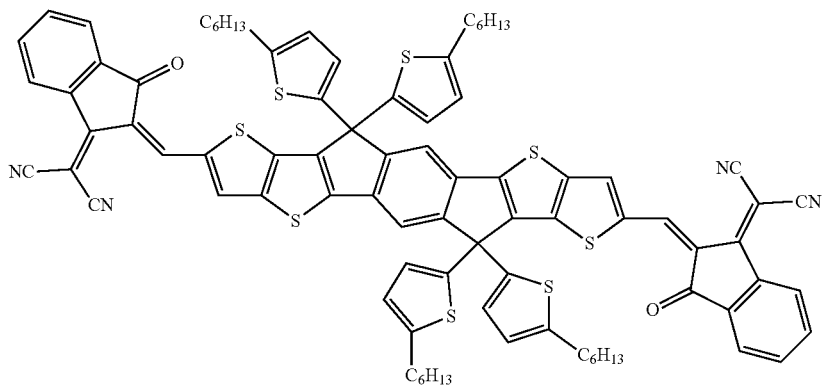

-continued
[Chemical Formula A-3]
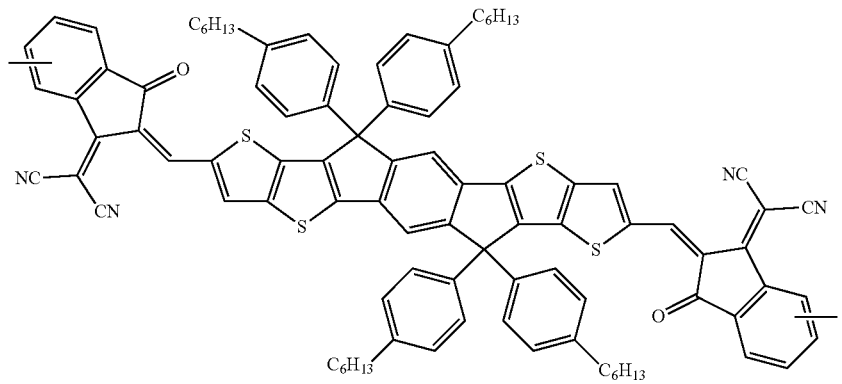
[Chemical Formula A-4]
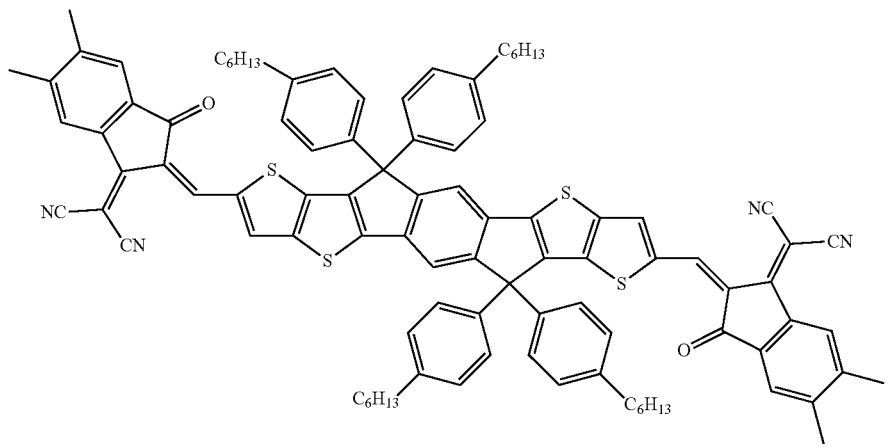
[Chemical Formula A-5]
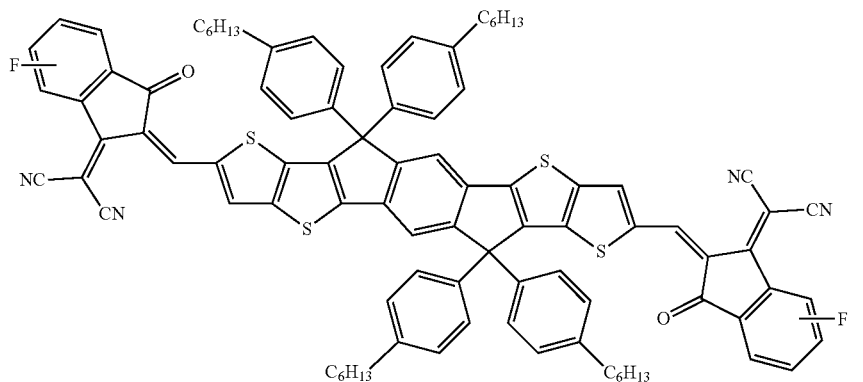
or -continued
[Chemical Formula A-6]
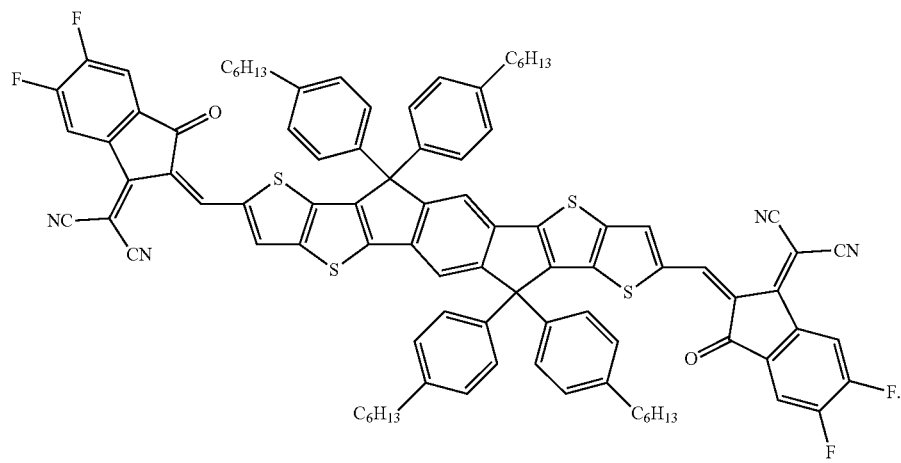
13. The organic solar cell of claim 9, wherein the electron donor and the electron acceptor have a mass ratio of 2:1 to 1:5.
14. The polymer of claim 1, wherein the third unit includes a structure of Chemical Formula 3-6.
15. The polymer of claim 1, wherein the third unit includes a structure of Chemical Formula 3-7.
* * * * *

UNITED STATES PATENT AND TRADEMARK OFFICE
CERTIFICATE OF CORRECTION

PATENT NO. : 11,711,966 B2  
APPLICATION NO. : 16/500871  
DATED : July 25, 2023  
INVENTOR(S) : Lee et al.

Page 1 of 1

It is certified that error appears in the above-identified patent and that said Letters Patent is hereby corrected as shown below:

In the Claims

Column 74, Claim 4: Please remove the chemical formula and replace with the following:
[Chemical Formula 2-1]

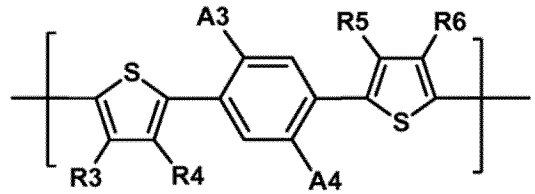

Column 85, Claim 7: Please remove the chemical formula and replace with the following:
[Chemical Formula 6-23]

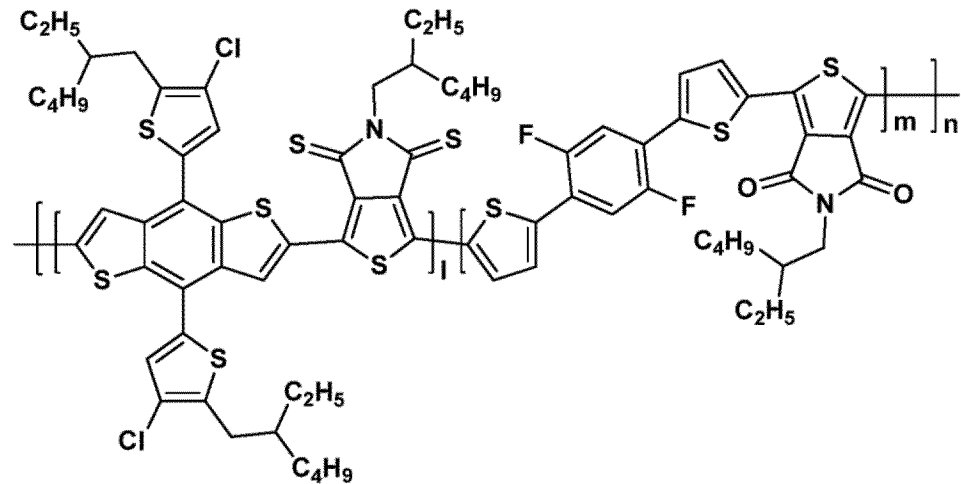

Signed and Sealed this  
Twenty-sixth Day of September, 2023

Katherine Kelly Vidal  
*Director of the United States Patent and Trademark Office*